United States Patent
Yug

(10) Patent No.: US 10,871,802 B2
(45) Date of Patent: Dec. 22, 2020

(54) DISPLAY DEVICE AND MANUFACTURING METHOD THEREOF

(71) Applicant: Samsung Display Co., LTD., Yongin-si (KR)

(72) Inventor: Geun Woo Yug, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 16/751,002

(22) Filed: Jan. 23, 2020

(65) Prior Publication Data
US 2020/0301474 A1 Sep. 24, 2020

(30) Foreign Application Priority Data
Mar. 21, 2019 (KR) .................... 10-2019-0032163

(51) Int. Cl.
*G06F 1/16* (2006.01)
*G06F 1/20* (2006.01)

(52) U.S. Cl.
CPC .......... *G06F 1/1652* (2013.01); *G06F 1/1609* (2013.01); *G06F 1/1626* (2013.01); *G06F 1/203* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,659,503 | B2* | 2/2014 | Kee ..................... | G06F 1/1601 345/1.3 |
| 10,212,811 | B1* | 2/2019 | Zhang ................ | G06F 1/1652 |
| 10,347,700 | B2* | 7/2019 | Yang .................. | H01L 51/0097 |
| 10,401,675 | B2* | 9/2019 | Lee .................... | G02F 1/13363 |
| 10,504,971 | B2* | 12/2019 | Yang .................. | H01L 27/323 |
| 10,586,941 | B2* | 3/2020 | Lee .................... | H01L 51/5253 |
| 10,620,668 | B2* | 4/2020 | Park ................... | G06F 1/1652 |
| 10,707,280 | B2* | 7/2020 | Jeong ................. | G06F 3/0418 |
| 2010/0201603 | A1* | 8/2010 | Kee ..................... | H04N 9/12 345/1.3 |
| 2014/0347576 | A1* | 11/2014 | Jeong ................. | G02F 1/13338 349/12 |

(Continued)

FOREIGN PATENT DOCUMENTS

| JP | 2016157110 | 9/2016 |
|---|---|---|
| KR | 101290519 | 7/2013 |

(Continued)

OTHER PUBLICATIONS

Extended European Search Report—European Application No. EP 20163837.6 dated Jul. 7, 2020, citing references listed within.

*Primary Examiner* — Lisa Lea-Edmonds
(74) *Attorney, Agent, or Firm* — Cantor Colburn LLP

(57) ABSTRACT

A display device includes a polymer base layer including a first surface and a second surface opposite to the first surface; and a display panel including a third surface facing the second surface and a fourth surface opposite to the third surface, where the polymer base layer includes a first outer side surface adjacent to the first surface, a second outer side surface adjacent to the second surface and spaced outward from the first outer side surface, and a cut surface disposed between the first outer side surface and the second outer side surface.

20 Claims, 23 Drawing Sheets

(56) References Cited

U.S. PATENT DOCUMENTS

| | | | |
|---|---|---|---|
| 2015/0053943 A1* | 2/2015 | Cho | H01L 27/323 |
| | | | 257/40 |
| 2017/0278900 A1* | 9/2017 | Yang | H01L 51/0097 |
| 2018/0074358 A1 | 3/2018 | Jeon et al. | |
| 2018/0095502 A1* | 4/2018 | Yamazaki | G06F 1/1643 |
| 2018/0151835 A1 | 5/2018 | Kim et al. | |
| 2019/0061318 A1* | 2/2019 | Jung | H01L 27/32 |
| 2019/0082528 A1* | 3/2019 | Zhang | H05K 1/028 |
| 2019/0086709 A1* | 3/2019 | Lee | G06F 1/1643 |
| 2019/0346887 A1* | 11/2019 | Park | G06F 1/1652 |
| 2020/0064886 A1* | 2/2020 | Cho | G09F 9/301 |
| 2020/0073441 A1* | 3/2020 | Shin | G06F 1/1643 |
| 2020/0089277 A1* | 3/2020 | Park | G06F 1/1641 |
| 2020/0098830 A1* | 3/2020 | Yang | H01L 27/323 |
| 2020/0183457 A1* | 6/2020 | Youn | G06F 1/1652 |
| 2020/0212338 A1* | 7/2020 | Ha | H01L 27/323 |
| 2020/0225699 A1* | 7/2020 | Yu | G06F 1/1652 |
| 2020/0233461 A1* | 7/2020 | Kim | H04M 1/0268 |

FOREIGN PATENT DOCUMENTS

| | | |
|---|---|---|
| KR | 101425492 | 8/2014 |
| KR | 1020150001829 | 1/2015 |
| KR | 1020170025942 | 3/2017 |
| KR | 1020170082213 | 7/2017 |
| KR | 1020180059162 | 6/2018 |
| KR | 1020180109012 | 10/2018 |

* cited by examiner

DISPLAY DEVICE AND MANUFACTURING METHOD THEREOF

This application claims priority to Korean Patent Application No. 10-2019-0032163, filed on Mar. 21, 2019, and all the benefits accruing therefrom under 35 U.S.C. § 119, the content of which in its entirety is herein incorporated by reference.

BACKGROUND

1. Field n

The invention relates to a display device and a manufacturing method thereof, and, more particularly, to a display device manufactured by laser cutting and a manufacturing method thereof.

2. Description of the Related Art

The importance of a display device has increased with the development of multimedia. Accordingly, various types of display devices such as an organic light emitting display ("OLED") and a liquid crystal display ("LCD") have been widely used. Such display devices may be used for various mobile electronic appliances such as smart phones, smart watches, and tablet personal computers ("PC"s).

Recently, a foldable display device has attracted considerable attention. The foldable display device may be used for smart phone and table PC to realize good portability and a wide screen.

SUMMARY

In a foldable display device, the folding operation of the display device may apply stress to each layer constituting the display device. An adhesive layer used for the attachment of laminate structures may cause defective film separation when exposed to such stress.

Embodiments of the invention relate to a display device which is manufactured by irradiation with lasers having different energy to minimize a carbonized area formed on a polymer base layer.

Embodiments of the invention relate to a method of manufacturing a display device, in which defects and processing time due to foreign matter that may be generated during a laser cutting process are minimized.

According to an embodiment of the discloser, a display device includes a polymer base layer including a first surface and a second surface opposite to the first surface; and a display panel including a third surface facing the second surface and a fourth surface opposite to the third surface, where the polymer base layer includes a first outer side surface adjacent to the first surface, a second outer side surface adjacent to the second surface and spaced outward from the first outer side surface, and a cut surface disposed between the first outer side surface and the second outer side surface.

In an exemplary embodiment, a third outer side surface, which is an outer side surface of the display panel, may be aligned with surface extending from the second outer side surface.

In an exemplary embodiment, a first end of the first outer surface contacting the first surface may be recessed inward from a second end of the first outer surface contacting the cut surface.

In an exemplary embodiment, the first outer side surface may have a shape inclined from the second end toward the first end.

In an exemplary embodiment, the second end of the first outer side surface may be in contact with the second outer side surface, and a part of the cut surface overlaps the first outer side surface.

In an exemplary embodiment, the first outer side surface may include a first sub outer side surface and a second sub outer side surface, in which a part of an area between the first end and the second end is recessed inward, and the cut surface may include a first cut surface between the second outer side surface and the first sub outer side surface, and a second cut surface between the first sub outer side surface and the second sub outer side surface.

In an exemplary embodiment, a height of the second outer side surface may be in a range of about 20% to about 40% of a thickness of the polymer base layer, and a width of the cut surface may be in a range of about 40% to about 75% of height of the second outer side surface.

In an exemplary embodiment, the height of the second outer side surface may be in a range of about 40 micrometers (μm) to about 50 μm, and the width of the cut surface may be in a range of about 20 μm to about 30 μm.

In an exemplary embodiment, the polymer base layer may include polyimide.

In an exemplary embodiment, the display device may further include a polarizing member disposed on the fourth surface of the display panel; a cover window disposed on the polarizing member; and a heat radiation member disposed on the first surface of the polymer base layer.

In an exemplary embodiment, the display device may include linear portions and curved portions, and at least one of the linear portions may include a first sub-linear portion, a second sub-linear portion spaced apart from the first sub-linear portion in one direction, and a sub-curved portion connecting the first sub-linear portion and the second sub-linear portion.

According to another embodiment of the discloser, a display device, which is an in-foldable display where a display surface thereof is folded to face inward, the display device includes a display panel including a front surface and a rear surface, where the display panel displays an image on the front surface thereof; a polarizing member disposed on the front surface of the display panel; a cover window disposed on the polarizing member; a polymer base layer including a first surface and a second surface opposite to facing the first surface, and disposed on the rear surface of the display panel; and a heat radiation member disposed under the polymer base layer, where the polymer base layer includes a first outer side surface adjacent to the first surface, a second outer side surface adjacent to the second surface and spaced outward from the first outer side surface, and a cut surface disposed between the first outer side surface and the second outer side surface, and a third outer side surface, which is an outer side surface of the display panel, is aligned with a surface extending from the second outer side surface.

In an exemplary embodiment, a height of the second outer side surface may be in a range of about 20% to about 40% of a thickness of the polymer base layer, and a width of the cut surface may be in a range of about 40% to about 75% of height of the second outer side surface.

In an exemplary embodiment, the display device may include linear portions and curved portions, and at least one of the linear portions may include a first sub-linear portion, a second sub-linear portion spaced apart from the first sub-linear portion in one direction, and a sub-curved portion connecting the first sub-linear portion and the second sub-linear portion.

According to an embodiment of the discloser, a method of manufacturing a display device includes preparing a first laminate including a display panel and a polymer base layer disposed on the display panel; irradiating one surface of the polymer base layer with a first laser to form a hole portion in which a part of the one surface is recessed; and irradiating the hole portion with a second laser different from the first laser to form a second laminate by cutting a part of the polymer base layer and a part of the display panel.

In an exemplary embodiment, the hole portion may include a first cutting line perpendicular to the one surface of the polymer base layer and a first cut surface horizontal to the one surface thereof, and the second laser may be applied to the first cut surface.

In an exemplary embodiment, when the second laser is applied to the hole portion to cut the part of the display panel and the part of the polymer base layer, and the polymer base layer of the second laminate includes the first cutting line, a second cutting line protruding outward from the first cutting line, and a second cut surface which is an area between the first cutting line and the second cutting line.

In an exemplary embodiment, energy density of the first laser may be in a range of about 20% to about 30% of energy density of the second laser.

In an exemplary embodiment, a width of the first cut surface may be in a range of about 2 times to about 2.5 times of a width of the first laser.

In an exemplary embodiment, the display panel may be disposed on another surface of the polymer base layer opposite to the one surface of the polymer base layer, and an outer side surface of the display panel is aligned with surface extending from the second outer side surface.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1:
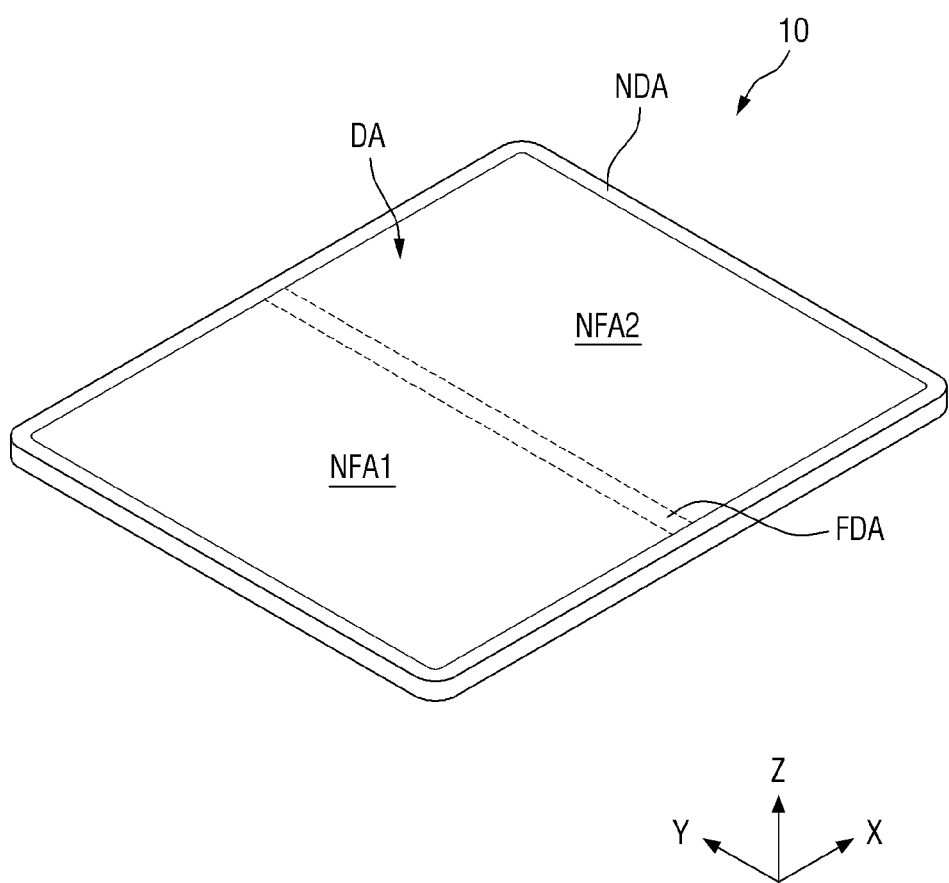
FIG. 1 is a perspective view of a display device according to an embodiment.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In this specification, the "on", "over", "top", "upper side", or "upper surface" refers to a Z-axis direction, and the "beneath", "under", "bottom", "lower side", or "lower surface" refers to a direction opposite to the Z-axis direction. Further, the "left", "right", "upper", and "lower" refer to directions when the drawings are viewed from the plane. For example, the "left" refers to a direction opposite to the X-axis direction, the "right" refers to the X-axis direction, the "upper" refers to the Y-axis direction, and the "lower" refers to a direction opposite to the Y-axis direction.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
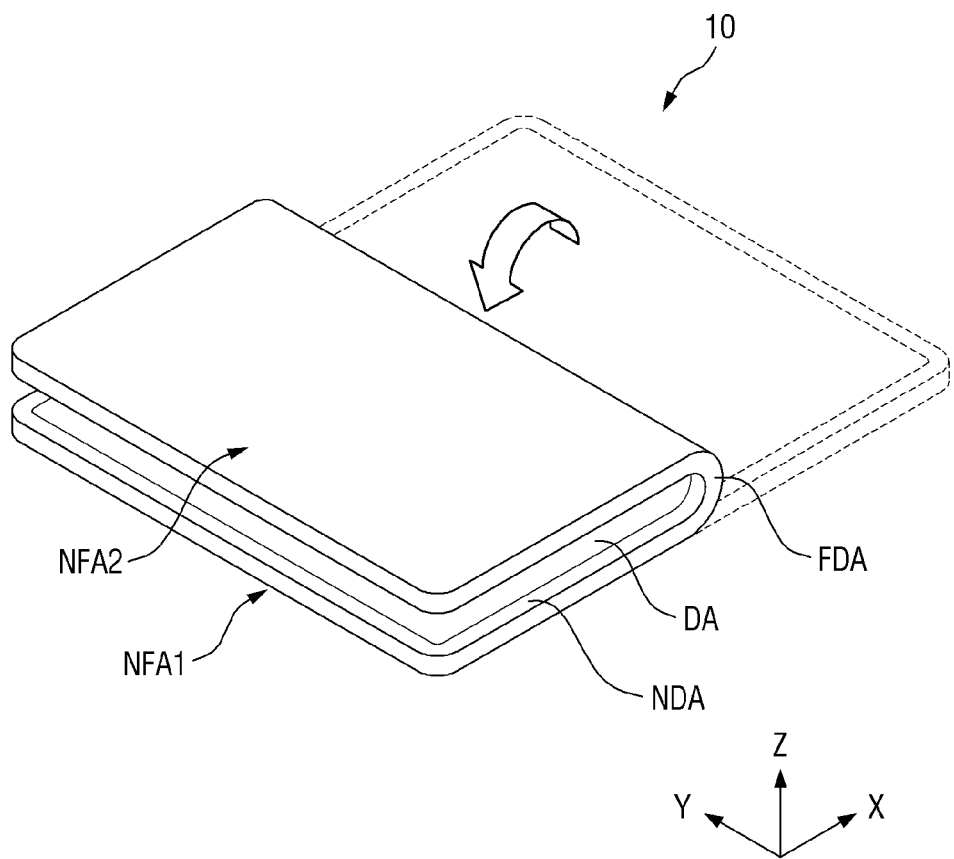
FIG. 2 is a perspective view showing the display device of FIG. 1 in a folded state.

FIG. 1 is a perspective view of a display device according to an embodiment, and FIG. 2 is a perspective view showing the display device of FIG. 1 in a folded state.

Referring to FIGS. 1 and 2, an embodiment of a display device 10 displays a screen or an image through a display area DA, and various devices including the display area DA may be included therein. Embodiments of the display device 10 may include, but are not limited to, a mobile phone, a tablet personal computer ("PC"), a personal digital assistant ("PDA"), a portable multimedia player ("PMP"), a television, a game machine, a watch type electronic device, a head mount display, a monitor of a PC, a notebook computer, a car navigator, a car instrument panel, a digital camera, a camcorder, an external billboard, an electric signal board, various medical devices, various inspection devices, various household appliances including a display unit DA such as a refrigerator and a washing machine, and internet of things ("IoT") devices. Embodiments of a display device to be described later may include, but are not limited to, a foldable smart phone, a tablet PC, and a notebook, for example.

In an embodiment, the display device 10 may have a substantially rectangular shape on the plan view. In one embodiment, for example, the display device 10 may have a rectangular shape, when viewed from a plan view, in which corners are right angled, or a rectangular shape in which corners are rounded. The display device 10 may include four sides or edges. The display device 10 may include long sides and short sides.

The display device 10 may include one surface and an opposing surface opposite to the one surface. At least one of the one surface and the opposing surface of the display device 10 may be a display surface. In an embodiment, the display surface is defined on the one surface of the display device 10, and an image may not be displayed toward the opposing surface thereof. Hereinafter, such an embodiment of the invention will be mainly described in detail, for convenience of description, but not being limited thereto. Alternative, the display device may be a double-sided display device in which an image display is performed on the one side and the opposing side, for example.

The display device 10 may be divided into a display area DA for displaying an image and a non-display area NDA disposed around the display area DA depending on whether or not an image is displayed on the one surface.

The display area DA may include a plurality of pixels. A pixel is a basic unit for displaying an image. The pixels may include, but are not limited to, a red pixel, a green pixel, and a blue pixel. The pixels may further include a white pixel. The plurality of pixels may be alternately arranged on the plane. In one embodiment, for example, the pixels may be arranged substantially in a matrix form, but the invention is not limited thereto.

The non-display area NDA may be disposed around the display area DA. The non-display area NDA may surround the display area DA. In an embodiment, the display area DA may be in a rectangular shape, and the non-display area NDA may be disposed around the four sides of the display area DA, but the invention is not limited thereto. The non-display area NDA is provided with or defined by a black matrix form to prevent light emitted from adjacent pixels from leaking.

The display device 10 may be a foldable device. As used herein, the term "foldable device", which is a device capable of being folded, refers to a device may be in both a folded state and an unfolded state as well as a device only be in a folded state. The folding typically includes a case of folding at an angle of about 180°, but the invention is not limited thereto. It may be understood that the display device 10 is folded even when the folding angle is more than 180° or less than 180°, for example, when the folding angle is more than 90° and less than 180° or more than 120° and less than 180°. Herein, it may be understood that the display device 10 is folded when the display device 10 is bent out of the unfolding state although the display device 10 is not completely folded. In one embodiment, for example, even when the display device 10 is bent at an angle of 90° or less, as long as the maximum folding angle is 90° or more, this state may be expressed as a folded state to distinguish such a state from an unfolded state. The curvature radius upon folding may be about 5 millimeters (mm) or less, e.g., about 1 mm to about 2 mm, or about 1.5 mm, but is not limited thereto.

The display device 10 may be folded on the basis of an imaginary folding line FDA (or folding axis). The folding line FDA may be a straight line extending in one direction on the plane. In an embodiment, as illustrated in the drawings, the folding line FDA extends in parallel to the short side of the display device 10, the invention is not limited thereto. Alternatively, the folding line FDA may be parallel to the long side of the display device 10, or may be inclined with respect to the short side and long side thereof.

In an embodiment, the folding line FDA of the display device 10 may be fixed at a specific position. The number of the folding lines FDA fixed at a specific position may be one or greater. In an alternative embodiment, the position of the folding line FDA is not specified in the display device 10, and may be freely set in various areas.

The display device 10 may be divided into a first unfolding area NFA1 and a second unfolding area NFA2 on the basis of the folding line FDA. The first unfolding area NFA1 may be located at one side of the folding line FDA, and the second unfolding area NFA2 may be at the other side of the folding line FDA. In an embodiment, where the folding line FDA is fixed at a specific position, the first unfolding area NFA1 and the second unfolding area NFA2 may be specified as areas where no folding occurs. In an embodiment, the specified first unfolding area NFA1 and second unfolding area NFA2 may have a same width as each other, but the invention is not limited thereto. In an embodiment, where the folding line FDA is not specified, the first unfolding area NFA1 and the second unfolding area NFA2 may be changed depending on the position where the folding line FDA is set.

In an embodiment, the display area DA of the display device 10 may be disposed over or defined in both the first unfolding area NFA1 and the second unfolding area NFA2. In such an embodiment, the display area DA may be located at the folding line FDA corresponding to the boundary between the first unfolding area NFA1 and the second unfolding area NFA2. In such an embodiment, the display area DA of the display device 10 may be continuously disposed regardless of the boundary between the first unfolding area NFA1 and the second unfolding area NFA2. However, the invention is not limited thereto. Alternatively, the display area DA may be disposed in the first unfolding area NFA1, but the display area DA may not be disposed in the second unfolding area NFA2. In an embodiment, the display area DA is disposed in the first unfolding area NFA1 and the second unfolding area NFA2, but the non-display area NDA may not be disposed in the folding line FDA.

The display device 10 may be folded in an in-folding manner (illustrated in FIG. 2) in which the display surface is folded in a way to face inward, and may also be folded in an out-folding manner in which the display surface is folded in a way to face outward. The display device 10 may be folded by only one of an in-folding manner and an out-folding manner, or may be folded by both an in-folding manner and an out-folding manner. In an embodiment, where the display device 10 is folded by both an in-folding manner and an out-folding manner, in-folding and out-folding may be performed on the basis of a same folding line FDA, or the display device 10 may include a plurality of folding lines FDA, such as folding lines only for in-folding and folding lines only for out-folding, which perform folding in different manners.

In an embodiment, a display panel, a layer laminated thereon, and a substrate have flexible properties, such that the display device 10 may be folded by folding all the corresponding members. In an alternative embodiments, at least a part of the display panel or some of the members laminated thereon may have a separate shape with respect to the folding line FDA. In such an embodiment, the separated member located in the unfolding area may not have flexible properties.

Figure 3:
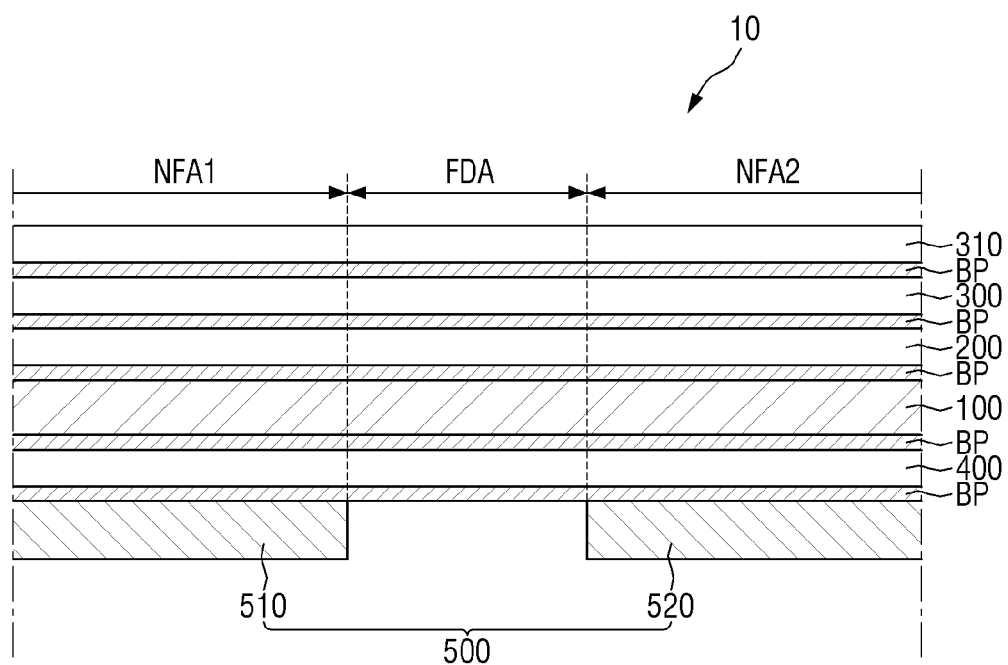
FIG. 3 is a cross-sectional view of a display device in an unfolded state according to an embodiment.
Figure 4:
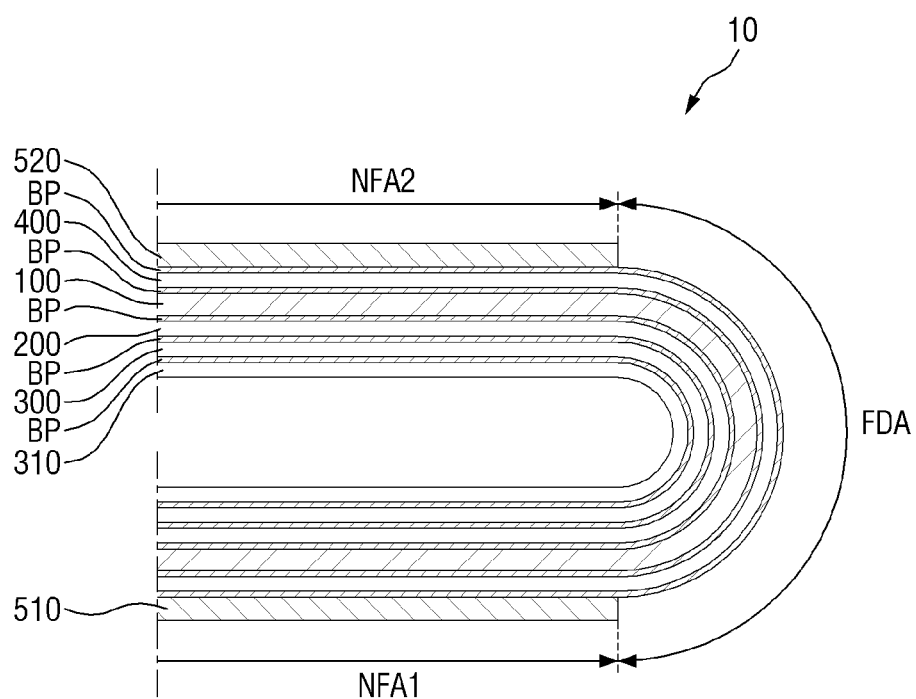
FIG. 4 is a cross-sectional view of a display device in a folded state according to an embodiment.

FIG. 3 is a cross-sectional view of a display device in an unfolded state according to an embodiment, and FIG. 4 is a cross-sectional view a display device in a folded state according to an embodiment.

Referring to FIGS. 3 and 4, an embodiment of the display device 10 may include a display panel 100, a polarizing member 200, a cover window 300, a polymer base layer 400, and a heat radiation member 500. The display device 10 includes an adhesive member BP, and the adhesive member BP may attach the respective members to each other. Here, the front of the display panel 100 refers to a direction in which the display panel 100 displays an image, and the back (or rear) of the display panel 100 refers to a direction opposite to the front thereof. One surface of the display panel 100 may be located at the front, and the opposing surface of the display panel 100 may be located at the back.

The display panel 100 is a panel for displaying an image, and the display panel 100 may include at least one of: self-luminous display panels such as an organic light emitting display panel ("OLED"), an inorganic light emitting display panel, a quantum dot light emitting display panel ("QED"), a micro light emitting diode ("LED") display panel, a nano LED display panel, a plasma display panel ("PDP"), a field emission display panel ("FED"), and a cathode ray display panel ("CRT"); and light receiving display panels such as a liquid crystal display panel ("LCD") and an electrophoretic display panel ("EPD"). Hereinafter, for convenience of description, embodiments where the display panel 100 is an organic light emitting display panel will be described in detail, and the organic light emitting display panel applied to an embodiment will be simply referred to as the display panel 100 unless specifically described otherwise. However, the embodiments of the display panel 100 are not limited to the organic light emitting display panel, and other display panels listed above or known in the art may be used as the display panel 100 without departing from the teaching herein.

The display panel 100 may further include a touch member. The touch member may be provided as a separate panel or film and attached to the display panel 100, but may be provided in the form of a touch layer in the display panel 100. In the drawings, for convenience of illustration, embodiments where the touch member is provided in the display panel 100 and included in the display panel 100 is illustrated, but the invention is not limited thereto.

Figure 5:
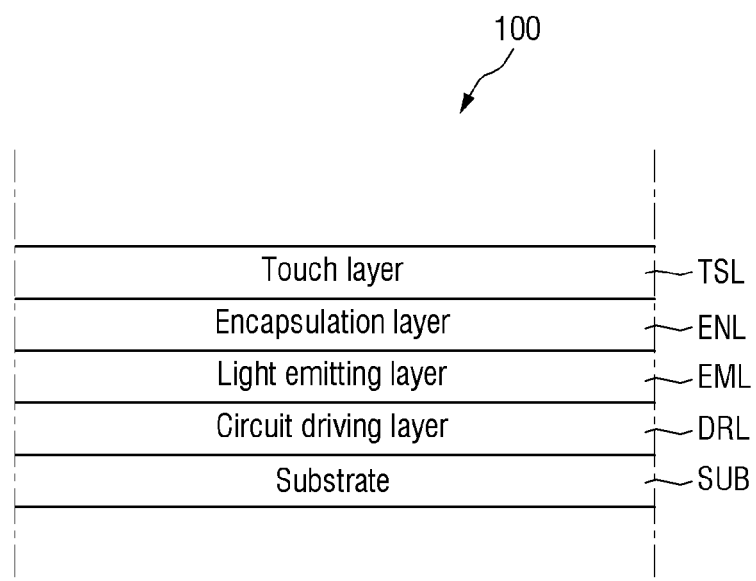
FIG. 5 is a cross-sectional view of a display panel according to an embodiment.

FIG. 5 is a cross-sectional view of a display panel according to an embodiment.

Referring to FIG. 5, an embodiment of the display panel 100 may include a substrate SUB, a circuit driving layer DRL on the substrate SUB, a light emitting layer EML on the circuit driving layer DRL, an encapsulation layer ENL on the light emitting layer EML, and a touch layer TSL on the encapsulation layer ENL.

In an embodiment, the substrate SUB may be a flexible substrate including a flexible polymer material such as polyimide ("PI"). In such an embodiment, the display panel 100 may be warped, bent, folded or rolled. In an embodiment, the substrate may have a multi-layer structure including a plurality of sub-substrates overlapping each other in a thickness direction with a barrier layer therebetween. In such an embodiment, each of the sub-substrates may be a flexible substrate.

The circuit driving layer DRL may be disposed on the substrate SUB. The circuit driving layer DRL may include a circuit for driving the light emitting layer EML of the pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with various luminance corresponding to a driving signal transmitted from the circuit driving layer DRL.

An encapsulation layer ENL may be disposed on the light emitting layer EML. The encapsulation layer ENL may include an inorganic film or a laminated film of an inorganic film and an organic film.

The touch layer TSL may be disposed on the encapsulation layer ENL. The touch layer TSL is a layer for sensing a touch input, and may perform a function of a touch member. The touch layer TSL may include a plurality of sensing areas and a plurality of sensing electrodes.

Referring to FIGS. 3 and 4, the polarizing member 200 and the cover window 300 may be disposed at a side of the one surface of the display panel 100, that is, the front of the display panel 100. The polarizing member 200 and the cover window 300 may be sequentially laminated to define the one surface of the display panel 100, and a plurality of adhesive members BP may be disposed therebetween.

The polarizing member 200 polarizes light transmitted therethrough. The polarizing member 200 may serve to reduce reflection of external light. In an embodiment, the polarizing member 200 may be a polarizing film. The polarizing film may include a polarizing layer and protective substrates sandwiching the polarizing layer therebetween. The polarizing layer may include a polyvinyl alcohol film. The polarizing layer may be stretched in one direction. The stretching direction of the polarizing layer may be an absorption axis, and the direction perpendicular to the stretching direction may be a transmission axis. The protective substrates may be disposed on opposing surfaces of the polarizing layer, respectively. The protective substrates may include or be made of a cellulose resin such as triacetyl cellulose or a polyester resin, but the material thereof is not limited thereto.

The cover window 300 may be disposed in front of the polarizing member 200. The cover window 300 serves to protect the display panel 100. The cover window 300 may include a transparent material. In one embodiment, for example, the cover window 300 may include a glass or a plastic.

In an embodiment, where the cover window 300 includes a glass, the glass may be an ultrathin glass ("UTG") or a thin film glass. In an embodiment, where the glass is ultrathin glass (UTG) or thin film glass, the cover window 300 may be warped, bent, folded or rolled due to flexible properties thereof. The thickness of the glass may be in a range of about 10 micrometers (μm) to about 300 μm, e.g., in a range of about 30 μm to about 80 μm or about 50 μm. The glass of the cover window 300 may be soda lime glass, alkali aluminosilicate glass, borosilicate glass, or lithium alumina silicate glass. The glass of the cover window 300 may include chemically reinforced or thermally reinforced glass to have high strength. The chemical reinforcement of the glass may be performed through an ion exchange treatment process in an alkali salt. The ion exchange treatment process may be performed two or more times.

In an alternative embodiment, where the cover window 300 includes a plastic material, the cover window 300 may have high flexible properties. In an embodiment, the plastic material of the cover window 300 may include, but are not limited to, PI, polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, an ethylene vinylalcohol copolymer, polyethersulphone ("PES"), polyetherimide ("PEI"), polyphenylene sulfide ("PPS"), polyallylate, tri-acetyl cellulose ("TAC"), cellulose acetate propionate ("CAP"), or a combination thereof.

A cover window protection layer 310 may be disposed in front of the cover window 300. The cover window protection layer 310 may function as at least one of anti-scattering, shock absorption, anti-stamping, anti-fingerprint, and anti-glare of the cover window 300. The cover window protection layer 310 may include a transparent polymer film. The transparent polymer film may include at least one of polyethylene terephthalate ("PET"), PEN, PES, PI, polyacrylate ("PAR"), PC, PMMA, or a cycloolefin copolymer ("COC").

The adhesive member BP may attach the display panel 100, the polarizing member 200, and the cover window 300 to each other. The polymer base layer 400 and the heat radiation member 500, which will be described later, may also be attached to each other by the adhesive member BP. The adhesive member BP near the one surface of the display panel 100 may include a protection layer bonding member for attaching the cover window protection layer 310, a window bonding member for attaching the cover window 300, and a polarizing member bonding member for attaching the polarizing member 200. All of the adhesive members BP disposed near the one surface of the display panel 100, that is, in front of the display panel, may be optically transparent.

The polymer base layer 400 and the heat radiation member 500 may be disposed near the other surface of the display panel 100, that is, behind the display panel 100.

The polymer base layer 400 may include a polymer film. In one embodiment, for example, the polymer base layer 400 may include PI, PET, PC, polyethylene ("PE"), polypropylene ("PP"), polysulfone ("PSF"), PMMA, TAC, or a cycloolefin polymer ("COP"). The polymer base layer 400 may include a functional layer at an surface thereof. The functional layer may include, for example, a light absorbing layer. The light absorbing layer may include a light absorbing material such as a black pigment or a black dye. The light absorbing layer may be formed on a polymer film by coating or printing with black ink.

The heat radiation member 500 may be disposed behind the polymer base layer 400. The heat radiation member 500 serves to diffuse heat generated from the display panel 100 or other components of the display device 10. The heat radiation member 500 may include a metal plate. The metal plate may include a metal having high thermal conductivity, such as copper or silver. The heat radiation member 500 may be a heat radiation sheet including graphite, carbon nanotube, or the like.

In an embodiment, as shown in FIGS. 3 and 4, the heat radiation member 500 may include portions spaced apart from each other on the basis of the folding line FDA to facilitate the folding of the display device 10, but the invention is not limited thereto. In one embodiment, for example, the heat radiation member 500 may include a first heat radiation member 510 and a second heat radiation member 520. The first heat radiation member 510 may be disposed in the first unfolding area NFA1, and the second radiation member 520 may be disposed in the second unfolding area NFA2. The first heat radiation member 510 and the second heat radiation member 520 may be physically separated or spaced apart from each other with respect to the folding line FDA.

In an embodiment, as described above, the polymer base layer 400 and the heat radiation member 500 may be attached to each other by the adhesive member BP. In one embodiment, for example, the adhesive member BP near the opposing surface of the display panel 100 may include a polymer film bonding member for attaching the polymer base layer 400 and a heat radiation film bonding member for attaching the heat radiation member 500. In an embodiment, where the heat radiation member 500 includes portions separated from each other with respect to the folding line FDA, the heat radiation bonding member of the adhesive member BP may be separated in a same shape. Alternatively, as shown in FIG. 3, the heat radiation member 500 may be integrally formed as a single unitary unit without being separated for each of the unfolding areas NFA1 and NFA2.

In an embodiment, where the display device 10 displays an image through only the front surface thereof, the adhesive member BP disposed at the opposing surface of the display panel 100, that is, the adhesive member BP disposed at a rear side the display panel 100 may not be optically transparent.

Each of the adhesive members BP described above may include an adhesive material. Each of the adhesive members BP may include a pressure-sensitive adhesive layer. The respective adhesive members may have a same composition as each other, but may have different compositions depending on positions thereof and an element to be attached.

Some of the adhesive members BP may include an optically transparent adhesive layer or an optically transparent resin. In one embodiment, for example, the adhesive member BP for attaching the cover window 300 onto the display panel 100 may include an optically transparent adhesive layer or an optically transparent resin. However, the invention is not limited thereto.

Each of the plurality of adhesive members BP may have a thickness of about 300 µm or less. In an embodiment, all of the adhesive members BP may have a thickness of about 200 µm or less, e.g., a thickness of about 100 µm or less. The lower limit of the thickness of the adhesive member BP is not particularly limited, but may be about 10 µm or greater, or about 50 µm or greater to exhibit minimum adhesion.

Each of the adhesive members BP may be formed of or defined by a single adhesive layer, may be formed of or defined by a plurality of laminated adhesive layers, and may include adhesive layers on opposing surfaces of a substrate as a double-sided tape.

In an embodiment, the adhesive member BP may include a silicone-based adhesive. The silicone-based adhesive may include a siloxane resin. In such an embodiment, the silicone-based adhesive may include silicon gum including a polyorganosiloxane compound. The silicon gum may include a cross-linkable functional group such as a vinyl group. The silicone-based adhesive may further include an MQ resin having a three-dimensional steric molecular structure including monofunctional siloxane units and tetrafunctional siloxane units. The silicone-based adhesive may further include an additive including at least one of a borane compound and a borate compound.

In an alternative embodiment, the adhesive member BP may include an acrylic adhesive. The acrylic adhesive may include an acrylic polymer. The acrylic polymer is obtained by polymerizing acrylic monomers, and the acrylic monomers may be a main material. In such an embodiment, the acrylic monomers may include at least one of ethyl acrylate, n-butyl acrylate, t-butyl acrylate, isobutyl acrylate, n-hexyl acrylate, 2-ethylhexyl acrylate, n-octyl acrylate, isooctyl acrylate, n-nonyl acrylate, isononyl acrylate, n-decyl acrylate, isodecyl acrylate, n-dodecyl acrylate, n-tridecyl acrylate, n-tetradecyl acrylate, 2(2-ethoxyethoxy)ethyl acrylate, 2-hydroxyethyl acrylate, 2-hydroxypropyl acrylate, 3-hydroxypropyl acrylate, 2-hydroxybutyl acrylate, 4-hydroxybutyl acrylate, 6-hydroxyhexyl acrylate, 8-hydroxyoctyl acrylate, 10-hydroxydecyl acrylate, 12-hydroxylauryl acrylate, and [4-(hydroxymethyl)cyclohexyl]methyl acrylate, for example. The acrylic adhesive may further include an azo-based initiator such as 2,2'-azobisisobutyloniltrile, a filler such as silica or zirconia, a crosslinker, and an antistatic agent such as poly ethylenedioxythiophene: polystyrene sulfonate ("PEDOT:PSS") in addition to the acrylic polymer. In an embodiment, the acrylic adhesive may be prepared by mixing 120 parts by weight to 250 parts by weight of the acrylic monomers with a solvent and stirring and heating the mixed solution, adding 0.1 parts by weight to 1 part by weight of the azo-based initiator, 0.5 parts by weight to 1 part by weight of the filler, 1.5 parts by weight to 2.5 parts by weight of the crosslinker and 0.5 parts by weight to 1 part by weight of the antistatic agent to the solution, and then stirring and heating the resulting solution.

In another alternative embodiment, the adhesive member BP may include a crystalline polymer and a rubber-based polymer. In such an embodiment, the crystalline polymer may include at least one of polypropylene, syndiotactic polystyrene, polyamide, polycaprolactone, polycarbonatediol, PET, polyphenylene sulfide, polybutylene terephthalate ("PBT"), PAR, poly(DPAA), PEI, polyacetal, and polyoxymethylene ("POM"), for example.

In such an embodiment, the rubber-based polymer may include at least one of polybutadiene, polyisoprene, polyneoprene, polyisobutylene, cellulose acetate, polyvinyl acetate, and copolymers thereof, for example. The weight ratio of the crystalline polymer and the rubber-based polymer may be about 1:0.3 to about 1:1.5. In such an embodiment, the adhesive member may further include a carbamic acid ester polymer, an ester polymer and/or a (meth)acrylic acid ester polymer, and may further include a coupling agent such as a silane-based coupling agent, a titanate-based coupling agent, or a chromium-based coupling agent; an adhesion improver such as a rosin resin, a rosin ester resin, a terpene phenol resin, or a terpene resin; a yellowing inhibitor; or an antioxidant.

The constituent material and composition of the adhesive member BP are not limited to those described above, and may be applied to other constituents or compositions of adhesive materials known in the art.

Figure 15:
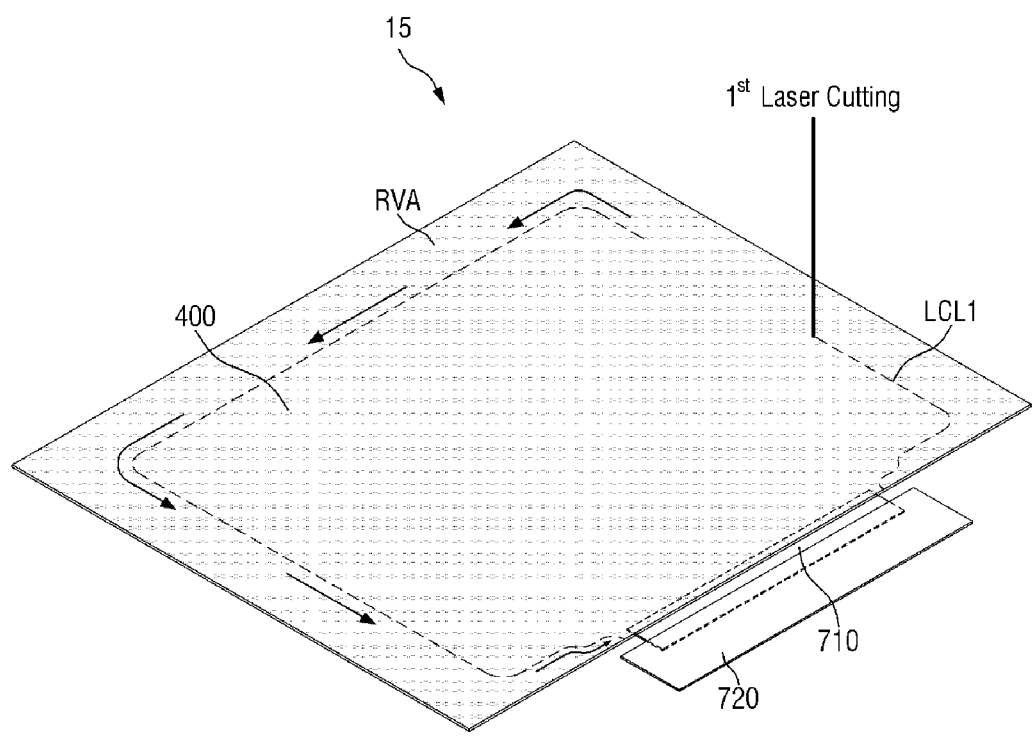
FIGS. 15 to 18 are schematic views showing a process of manufacturing a display device according to an embodiment.

In an embodiment, the display device 10 may be manufactured by forming a first laminate 11 including the display panel 100, the polymer base layer 400, the polarizing member 200, and the cover window 300 and attaching the heat radiation member 500 to one surface of the first laminate 11. In an embodiment, as shown in FIG. 15, the first laminate 11 may be formed by first forming a second laminate 15 having a larger area than the display device 10 and then partially removing the second laminate 15 to have the shape of the display device 10. According to an embodiment, the display device 10 may include the first laminate 11 formed by cutting a part of the second laminate 15 with a laser.

Figure 6:
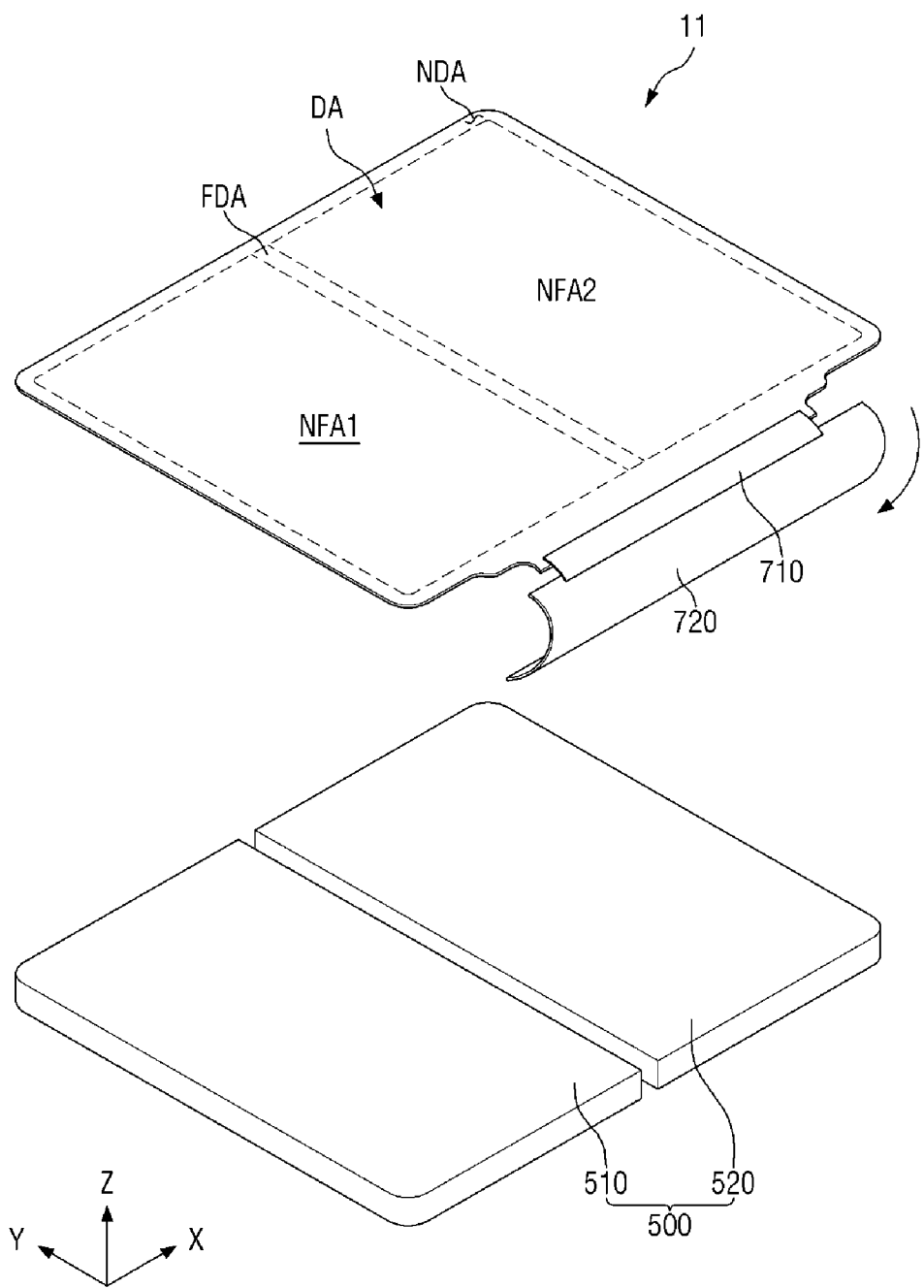
FIG. 6 is an exploded perspective view of a display device according to an embodiment.
Figure 7:
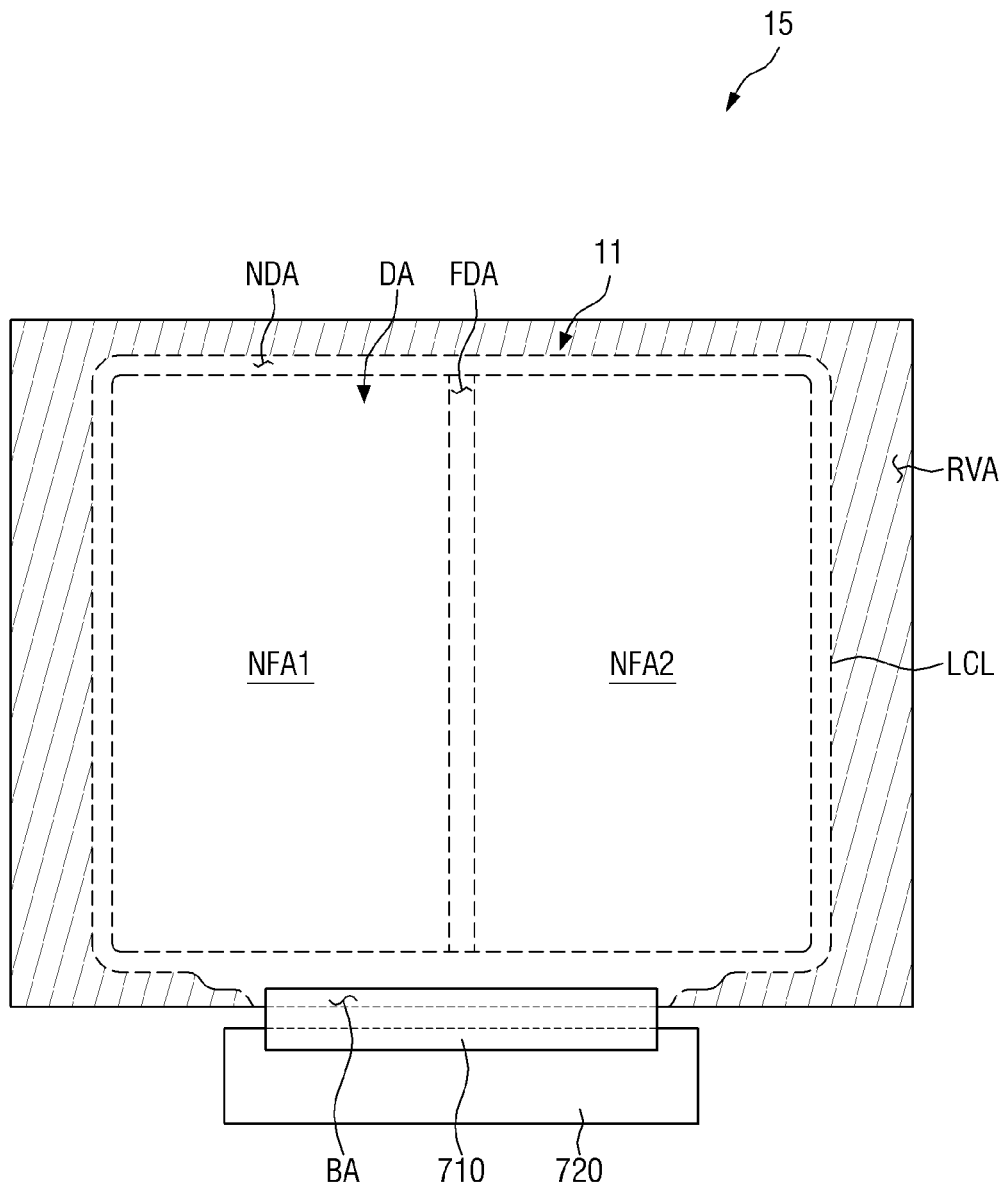
FIG. 7 is a plan view of a second laminate according to an embodiment.

FIG. 6 is an exploded perspective view of a display device according to an embodiment, and FIG. 7 is a plan view of a second laminate according to an embodiment.

Referring to FIGS. 6 and 7, an embodiment of the display device 10 may include a first laminate 11 and a heat radiation member 500 disposed under the first laminate 11. The first laminate 11 may include the display panel 100, the polarizing member 200, the cover window 300, the polymer base layer 400, and the plurality of adhesive members BP for attaching these components to each other. The display device 10 may be manufactured by forming the first laminate 11 and then placing the heat radiation member 500 on the lower surface of the first laminate 11.

In an embodiment, as shown in FIG. 7, the first laminate 11 may include a first circuit board 710 connected to the bonding area BA of the display panel 100 and a second circuit board 720 connected to the first circuit board 710. Unlike the polarizing member 200 and the cover window 300, one side of each of the display panel 100 and the polymer base layer 400 may partially protrude, and the display panel 100 and the polymer base layer 400 may be connected to the first circuit board 710 in the bonding area defined on one surface of the display panel 100. The first laminate 11 may include a bonding area BA at least partially protruding from one side of the first laminate 11 on which the first circuit board 710 is disposed. One side of the display panel 100 and polymer base layer 400 of the first laminate 11 protrudes from the polarizing member 200 and the cover window 300, and the bonding are BA may defined in the protruding area. Such a configuration of the display panel 100 and the polymer base layer 400 may be formed in the process of forming the first laminate 11 by cutting a part of the second laminate 15, as will be described later in detail.

The first circuit board 710 may be attached onto pads disposed on one side edge portion of the display panel 100 using an anisotropic conductive film. Accordingly, the lead lines of the first circuit board 710 may be electrically connected to the pads. The first circuit board 710 may be a flexible printed circuit board, a printed circuit board, or a flexible film such as a chip-on-film. The first circuit board 710 may be bent toward the lower portion of the display panel 100. In such an embodiment, one side of the first circuit board 710 may be attached to one side edge portion of the display panel 100, and the other side thereof may disposed under the display panel to be connected to a system board in which a host system is mounted.

The second circuit board 720 may include a circuit pad area attached to one side portion of the first circuit board 710. A plurality of circuit pads may be disposed in the circuit pad area of the second circuit board 720 and connected to the lead lines disposed on the first circuit board 710.

In an embodiment, as shown in FIG. 6, the first circuit board 710 may be bent in a direction opposite to the third direction (Z-axis direction), that is, in the downward direction of the first laminate 11. The other side of the first circuit board 710 and the second circuit board 720 may be located under the heat radiation member 500 of the display device 10. The lower surface of the heat radiation member 500 may be attached to the second circuit board 720 through a separate adhesive member, but the invention is not limited thereto.

The first laminate 11 including the first circuit board 710 and second circuit board 720 connected to the bonding area BA of the display panel 100 may be formed by cutting a part of the second laminate 15 shown in FIG. 7. The second laminate 15 may include the display panel 100, the polarizing member 200, the cover window 300, and the polymer base layer 400, each being manufactured to have a larger area than the display device 10. In an embodiment, the second laminate 15, similarly to the display device 10, may include a display area DA, a non-display area NDA, a folding line FA, and unfolding areas NFA1 and NFA2, and may include a removal area RVA located outside the non-display area NDA. As will be described later, in the process of manufacturing the display device 10, the removal area RVA of the second laminate 15 may be separated or removed in the cutting line LCL formed along the non-display area NDA to form the first laminate 11. In an embodiment, the first laminate 11 may be formed by separating the removal area RVA from the second laminate 15 through a cutting process using a laser. The second laminate 15 is irradiated with a laser along the cutting line LCL at the lower surface thereof, and the first laminate 11 produced by irradiating the laser along the cutting line LCL may have cutting lines LCL whose upper surface and lower surface are different from each other.

Figure 8:
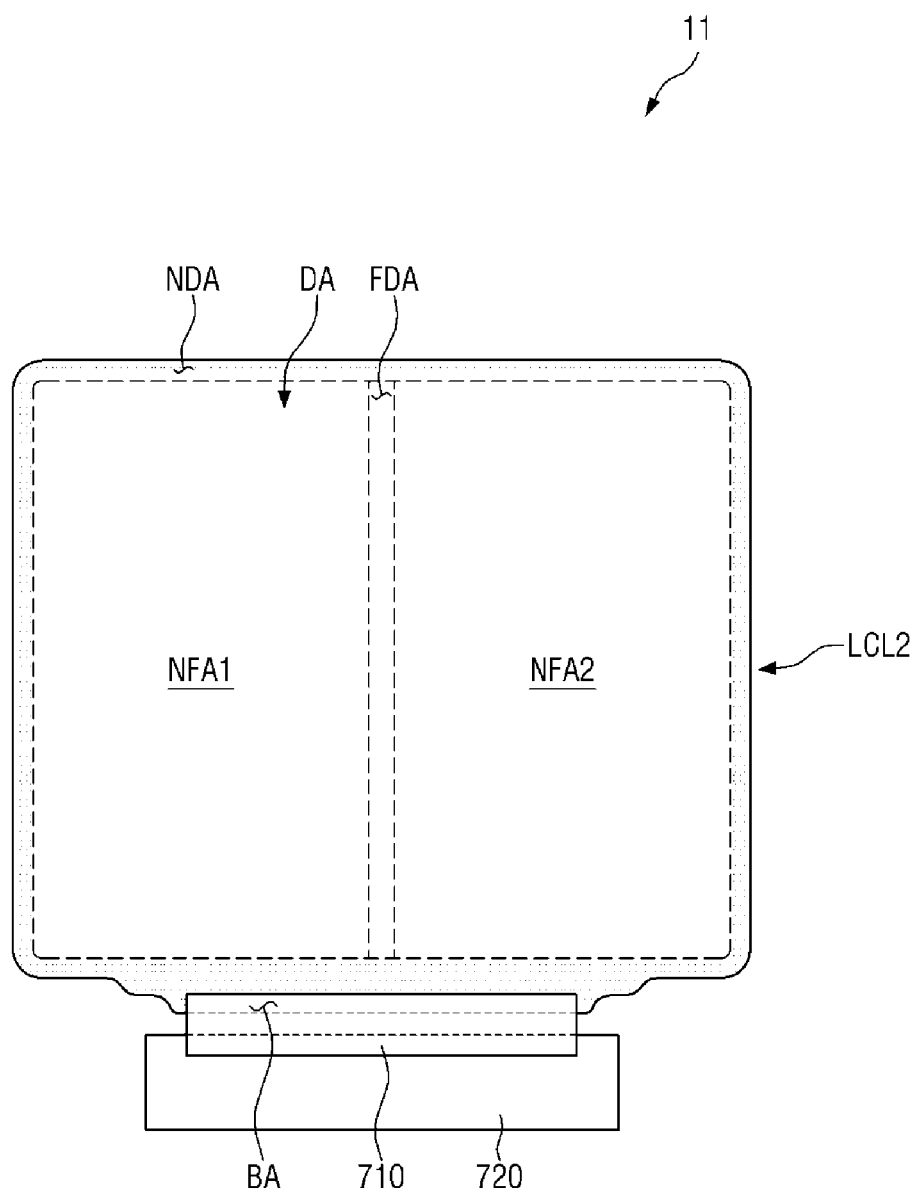
FIG. 8 is a plan view showing one surface of a first laminate according to an embodiment.
Figure 9:
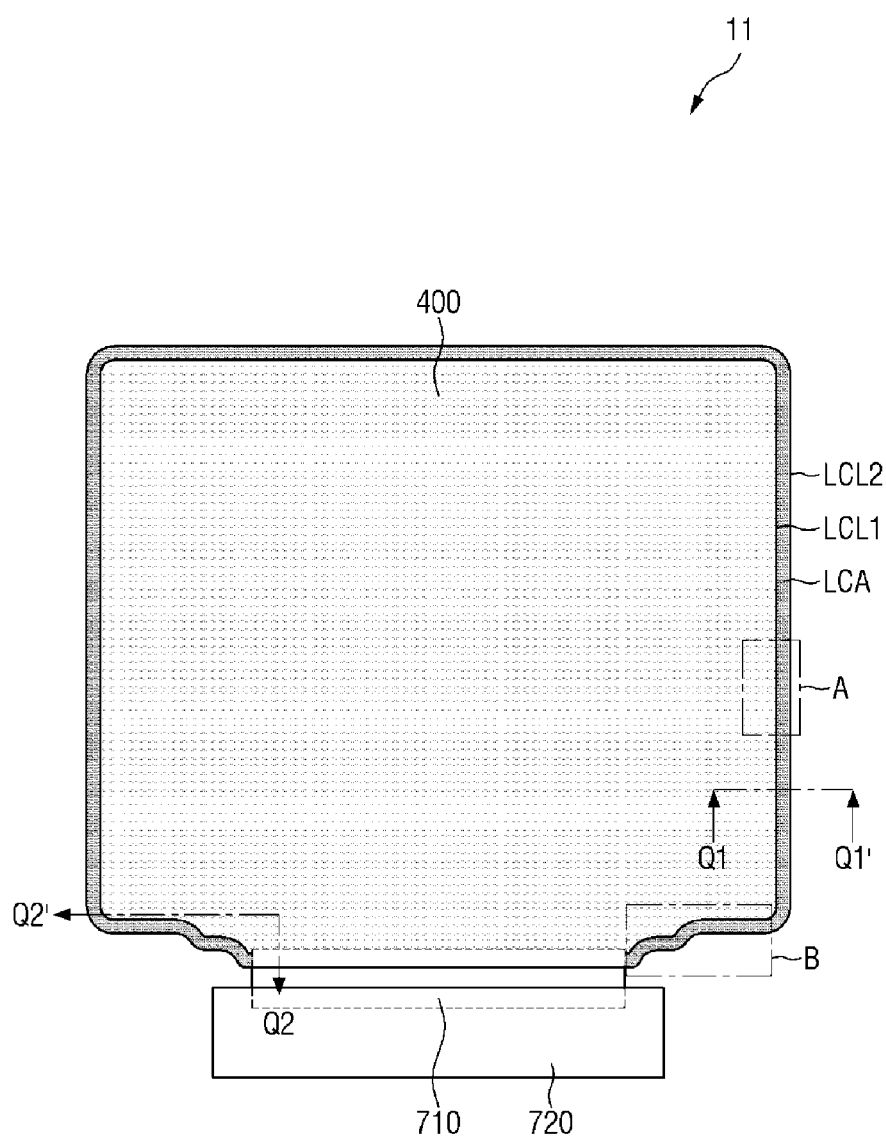
FIG. 9 is a plan view showing the other surface of a second laminate according to an embodiment.

FIG. 8 is a plan view showing one surface of a first laminate according to an embodiment, and FIG. 9 is a plan view showing the other surface of a second laminate according to an embodiment.

FIG. 8 is a plan view showing one surface of the first laminate 11, that is, a front surface thereof, and FIG. 9 is a plan view showing the other surface of the first laminate 11, that is, a rear surface thereof.

Referring to FIGS. 8 and 9, an embodiment of the first laminate 11 may include a cutting line LCL formed along the outer side surface of the non-display area NDA. The cutting line LCL may include a first cutting line LCL1 and a second cutting line LCL2 protruding from the first cutting line LCL1 toward the outside of the first laminate 11. The first cutting line LCL1 and the second cutting line LCL2 may be cutting lines of the outer periphery of the first laminate 11 when the first laminate 11 is viewed on a plane view, and may constitute the outer side surfaces of the first laminate 11. In such an embodiment, the first cutting line LCL1 may be a first outer side surface of the first laminate 11, and the second cutting line LCL2 may be a second outer side surface of the first laminate 11. Hereinafter, for convenience of description, the outer side surfaces of the first laminate 11 will be referred to as the first cutting line LCL1 and the second cutting line LCL2.

According to an embodiment, one surface of the first laminate 11 may include the second cutting line LCL2, and the other surface (or the opposing surface) thereof may include the first cutting line LCL1 and the second cutting line LCL2. One surface and the other surface of the first laminate 11 may form the second cutting line LCL2 placed on a same line on a plan view, and the other surface thereof may further include the first cutting line LCL1 spaced inward from the second cutting line LCL2.

One surface (shown in FIG. 8) of the first laminate 11 may include a display area DA, a non-display area NDA, a folding line FDA, and an unfolding area NFA, as the surface facing the front of the display panel 100. One surface of the first laminate 11 may include a second cutting line LCL2, and the second cutting line LCL2 may correspond to an outer side surface of the non-display area NDA. Although not shown, the second cutting line LCL2 extends to correspond to a part of the cover window 300, the polarizing member 200, the display panel 100 and the polymer base layer 400.

The other surface (shown in FIG. 9) of the first laminate 11 may include a lower surface of the polymer base layer 400 as a surface at the rear of the display panel 100. In such an embodiment, the other surface of the first laminate 11 may include a second cutting line LC2 and a first cutting line LCL1 spaced inward from the second cutting line LCL2. The first cutting line LCL1 may have substantially a same shape as the second cutting line LCL2, and may be spaced apart from the second cutting line LCL2 by a predetermined width. The first cutting line LCL1 extends to a portion of the polymer base layer 400. In such an embodiment of the first laminate 11, the polymer base layer 400 may include the first cutting line LCL1 and the second cutting line LCL2, and the cover window 300, the polarizing member 200 and the display panel 100 may include only the second cutting line LCL2.

In an embodiment, as described above, one surface of the first laminate may include the folding line FDA defined therein to be folded, and thus the display device 10 may be a foldable display device. In one embodiment, for example, the polymer base layer 400 may include a colored polyimide, and thus the display device 10 may have high durability even when it is folded and unfolded several times. In an embodiment, the first laminate 11 may be formed by irradiating the lower surface of the second laminate 15, that is, the upper surface of the polymer base layer 400 with a laser and removing a part of the second laminate 15. In such an embodiment, when the polymer base layer 400 including the colored polyimide is irradiated with a laser, a part of the polymer base layer 400 may be carbonized, and thus a part of the first laminate 11 may be contaminated or foreign matter may be generated. In the method of manufacturing the display device 10 according to an embodiment, the second laminate 15 may be cut using lasers having different energy densities from each other, and thus the contamination of the first laminate 11 and the generation of foreign matter, due to laser irradiation, may be effectively prevented even when the polymer base layer 400 includes the colored polyimide. Accordingly, an embodiment of the display device 10 according to an embodiment may include a first cutting line LCL1 formed by a first laser and a second cutting line LCL2 formed by a second laser, which will be described later in detail.

Figure 10:
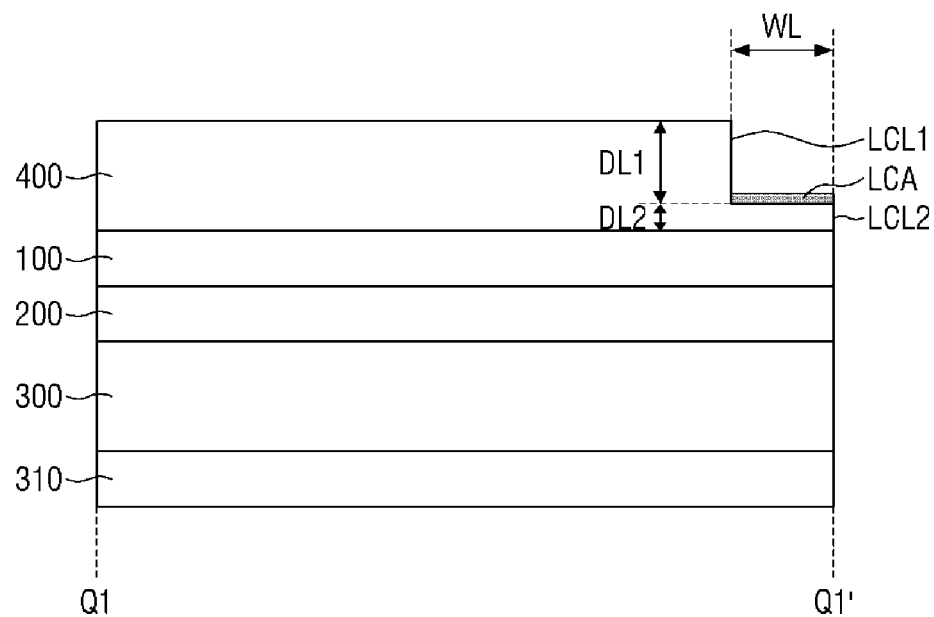
FIG. 10 is a cross-sectional view taken along line Q1-Q1' of FIG. 9.
Figure 11:
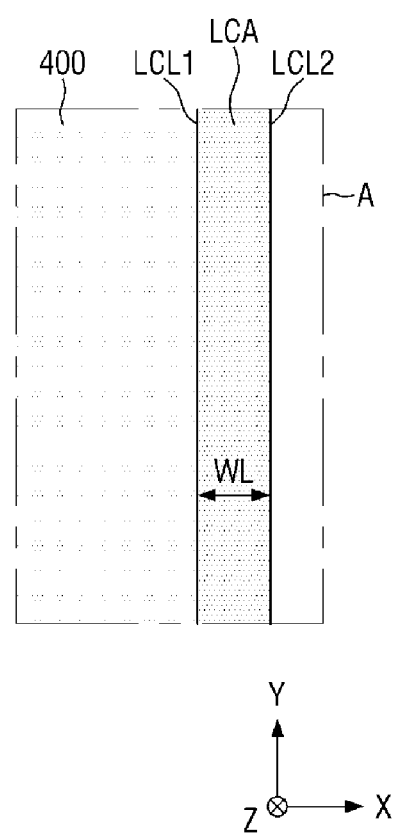
FIG. 11 is an enlarged view of the portion A in FIG. 9.

FIG. 10 is a cross-sectional view taken the line Q1-Q1' of FIG. 9, and FIG. 11 is an enlarged view of the portion A in FIG. 9.

FIG. 10 is a cross-sectional crossing the first cutting line LCL1 and the second cutting line LCL2 at one side of the first laminate 11, and FIG. 11 is an enlarged view showing the above one side. FIG. 10 shows only the display panel 100, polarizing member 200, cover window 300, cover window protection layer 310 and polymer base layer 400 of the first laminate 11, and the adhesive member BP is omitted in FIG. 10 for convenience of illustration.

In an embodiment, referring to FIGS. 10 and 11, the display device 10 may include a polymer base layer 400 including a first cutting line LCL1 and a second cutting line LCL2. In such an embodiment, the display device 10 includes a first laminate 11, and the polymer base layer 400 of the first laminate 11 has a first cutting line LCL1 and a second cutting line LCL2.

The first cutting line LCL1 may form or define an outer side surface adjacent to the upper surface of the polymer base layer 400 in the drawing, that is, the same surface as the rear surface of the display panel 100. The first cutting line LCL1 may be formed in a direction substantially perpendicular to the lower surface of the polymer base layer 400, and may be spaced apart from the lower surface of the polymer base layer 400 and terminated. In an embodiment, the first cutting line LCL1 may be formed by removing only a part of the polymer base layer 400.

The second cutting line LCL2 may form an outer side surface adjacent to the lower surface of the polymer base layer 400, that is, the other surface facing the front direction of the display panel 100. The second cutting line LCL2 may be spaced apart from the end of the first cutting line LCL1 of the polymer base layer 400 and extend to the cover window protection layer 310 of the first laminate 11. In such an embodiment, the second cutting line LCL2 may be an area of the polymer base layer 400 in which the first cutting line LCL1 is not formed, and may an area which the display panel 100, the polarizing member 200, the cover window 300, and the cover window protection layer 310 extend in a laminated direction thereof when such components are cut. In such an embodiment, the second cutting line LCL2 may be defined by the outermost surface of the first laminate 11 substantially including members such as the display panel 100.

In an exemplary embodiment, the polymer base layer 400 may include a cut surface LCA disposed between the first cutting line LCL1 and the second cutting line LCL2. The cut surface LCA may form a surface substantially parallel to the upper surface of the polymer base layer 400. The cut surface LCA may be an area where an upper portion of a part of the polymer base layer 400 is removed in the process of forming the first cutting line LCL1, and some of the particles formed by laser irradiation remain are disposed. In an embodiment, the cut surface LCA may be an area where a part of the polymer base material layer 400 is carbonized in the process of forming the first cutting line LCL1. As will be described later, in the process of forming the first cutting line LCL1, a laser having lower energy density is irradiated, as compared with the process of forming the second cutting line LCL2. The cut surface LCA may be formed only between the first cutting line LCL1 and the second cutting line LCL2 using a laser having low energy density, thereby minimizing the formation of the second cutting line LCL2 by the process of forming the second cutting line LCL2 or the contamination of the first laminate 11.

The cut surface of FIG. 10 may be formed in the laser process of forming the first cutting line LCL1, and may be a portion remaining after removing a part of the cut surface LCA in the laser process of forming the second cutting line LCL2. Accordingly, the cut surface LCA may be disposed in an area where one end of the first cutting line LCL1 is spaced apart from one end of the second cutting line LCL2. However, the invention is not limited thereto, and at least a part of the cut surface LCA may overlap the first cutting line LCL1, or a plurality of cut surfaces LCA may be provided.

In an embodiment, a height DL1 (or a length in a thickness direction of the polymer base layer 400) of the first cutting line LCL1 of the polymer base layer 400 may be greater than a height DL2 of the second cutting line LCL2 of the polymer base layer 400. In an embodiment, the height DL2 of the second cutting line LCL2 of the polymer base layer 400 may be minimized as much as practically possible to minimize the range in which a laser having high energy density is applied to the polymer base material layer 400 in the process of forming the second cutting line LCL2. In an embodiment, the height of the second cutting line LCL2 may be in a range of about 20% to about 40% of the entire thickness (DL1+DL2) of the polymeric base layer 400. In one embodiment, for example, the height of the second cutting line LCL2 may be in a range of about 40 μm to about 50 μm, but not being limited thereto.

In an embodiment, the first cutting line LCL1 may be spaced apart from the second cutting line LCL2 by a width WL of the cut surface LCA to prevent the contamination or foreign matter that may occur in the polymer base layer 400 in the process of forming the second cutting line LCL2. In an embodiment, the laser applied in the process of forming the first cutting line LCL1 may be applied onto the polymer base layer 400 with a predetermined width to form the cut surface LCA. In an embodiment, the width WL of the cut surface LCA may be in a range of about 40% to about 75% of the height DL2 of the second cutting line LCL2. In one embodiment, for example, the width WL of the cut surface LCA may be in a range of about 20 μm to about 30 μm, but not being limited thereto.

In an embodiment, the first laminate 11 may include a bonding area BA to which the first circuit board 710 is attached, and the bonding area BA may be defined on an area where the display panel 100 and the polymer base layer 400 protrude from the polarizing member 200 and the cover window 300.

Figure 12:
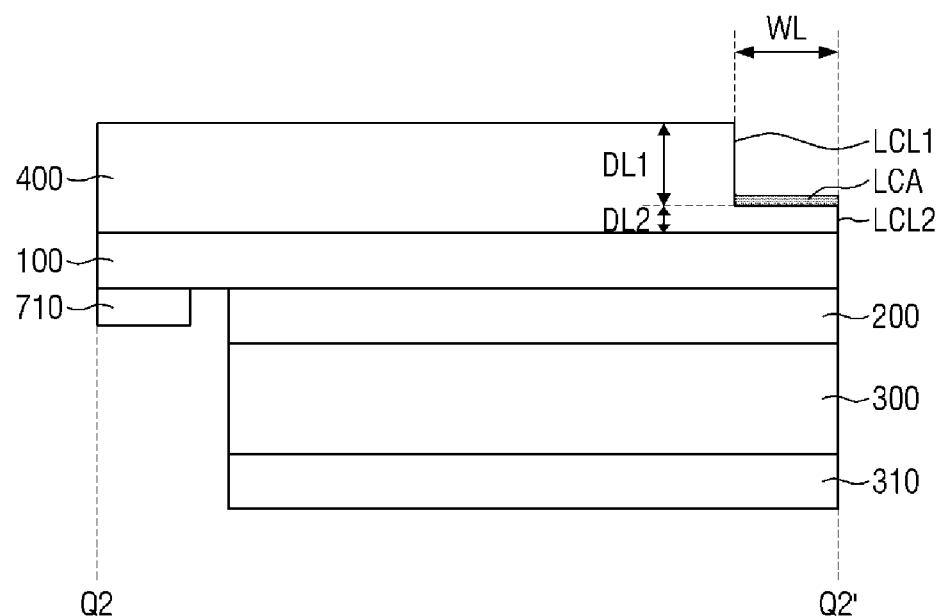
FIG. 12 is a cross-sectional view taken along line Q2-Q2' of FIG. 9.
Figure 13:
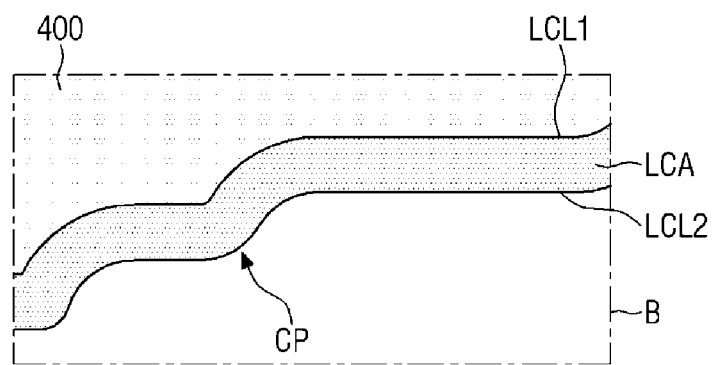
FIG. 13 is an enlarged view of the portion B in FIG. 9.

FIG. 12 is a cross-sectional view taken along line Q2-Q2' of FIG. 9, and FIG. 13 is an enlarged view of portion B in FIG. 9.

FIG. 12 is a cross-sectional view crossing one side including the bonding area BA of the first laminate 11. FIG. 13 is an enlarged view showing a sub-curved portion CP in an area adjacent to the bonding area BA of the first laminate 11.

Referring to FIGS. 9 and 12, the first laminate 11 may have a structure in which the display panel 100 and the polymer base layer 400 protrude from the polarizing member 200, and the first circuit board 710 may be attached to the display panel 100 in the protruding area. In an embodiment, as described above, the first circuit board 710 may be attached to the second circuit board 720. The first circuit board 710 and the second circuit board 720 may transmit a predetermined electrical signal to the display panel 100 coupled in the bonding area BA.

In an embodiment, the display device 10 including the first laminate 11 may include at least one linear portion and at least one curved portion. As shown in FIG. 9, when viewed from a plan view, the upper, left and right sides of the first laminate 11 may have linear portions extending in one direction, and the corner portion where the linear portions meet each other may include a curved portion rounded with a predetermined curvature. However, at least one of the linear portions facing the upper side of the first laminate 11 may protrude with a curvature at the lower side of the first laminate 11 which is at a side where the bonding area BA of the first laminate 11 is located. In an embodiment, the first laminate 11 may include a sub-curved portion CP at least one side of the first laminate 11 defined by a part of the one side thereof protruding with a curvature. The one side may include a first sub-linear portion, a second sub-linear portion spaced apart from the first sub-linear portion, and a sub-curved portion CP connecting the first sub-linear portion and the second sub-linear portion.

Referring to FIG. 13, a sub-curved portion CP, a part of which protrudes with a curvature, may be at one side of the first laminate 11 adjacent to the bonding area BA, that is, at the lower side of the first laminate 11. The sub-curved portion CP may connect a first sub-linear portion (not shown) extending in one direction in the bonding area BA attached to the first circuit board 710 and a second sub-linear portion (not shown) connected to the right side of the first laminate 11 through one curved portion. The extending line of the first sub-linear portion may be spaced apart from the extending line of the second sub-linear portion. The sub-curved portion CP may connect the first sub-linear portion and the second sub-linear portion in an area where the first sub-linear portion is spaced apart from the second sub-linear portion. The shape of the first laminate 11 may be formed by cutting the lower side of the second laminate 15 while moving along the shape of the sub-curved portion CP in the process of cutting a part of the second laminate 15. However, the invention is not limited thereto.

The structure of the first laminate 11 described above may be formed by irradiating the other surface of the second laminate 15 with lasers different from each other to remove a part of the second laminate 15 in the process of manufacturing the display device 10. In an embodiment, the first cutting line LCL1 of the first laminate 11 may be formed by irradiating the polymer base layer 400 with a first laser, and the second cutting line LCL2 of the first laminate 11 may be formed by irradiating the polymer base layer 400 and the display panel 100 with a second laser different from the first laser. Such features will be described later in greater detail.

Figure 14:
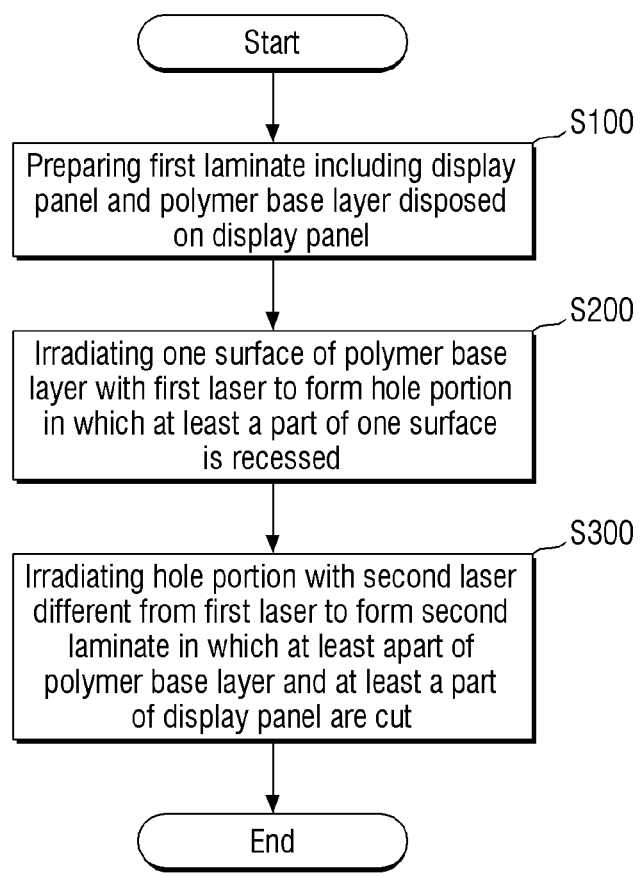
FIG. 14 is a flowchart showing a method of manufacturing a display device according to an embodiment.

FIG. 14 is a flowchart showing a method of manufacturing a display device according to an embodiment.

Referring to FIG. 14, an embodiment of a method of manufacturing a display device 10 may include: preparing a second laminate 15 including a display panel 100 and a polymer base layer 400 disposed on the display panel 100 (S100); irradiating one surface of the polymer base layer 400 with a first laser to form a hole portion HP in which a part of the one surface is recessed (S200); and irradiating the hole portion HP with a second laser different from the first laser to form a first laminate 11 in which the polymer base layer 400 and the display panel 100 are at least partially cut (S300).

In an embodiment, the display device 10 may include the first laminate 11, and the first laminate may be prepared by irradiating a second laminate 15 having a larger planar area than the first laminate 11 with a laser to cut a part of the second laminate 15. In such an embodiment, a process of preparing the first laminate by irradiating the second laminate 15 with a laser may be performed by irradiating the second laminate 15 with the first layer and second layer having different energy densities from each other. A first cutting line LCL1 may be formed by irradiating the second laminate with the first laser, and a second cutting line LCL2 may be formed by irradiating the second laminate with the second laser, and thus a part of the second laminate may be removed, thereby forming the first laminate 11.

FIGS. 15 to 18 are schematic views showing a process of manufacturing a display device according to an embodiment.

Figure 16:
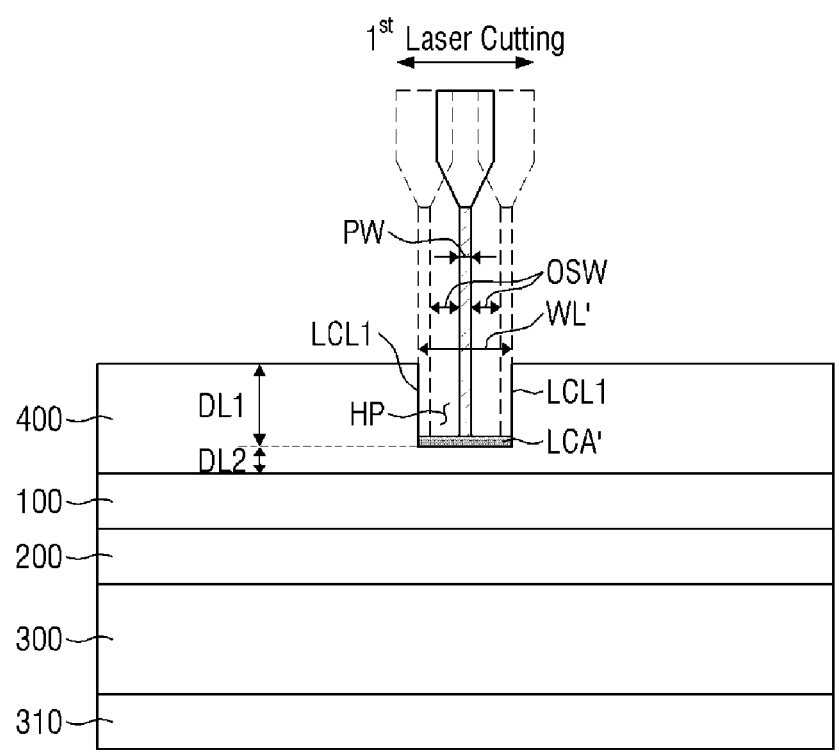

First, referring to FIGS. 15 and 16, a second laminate 15 including a polymer base layer 400 and a display panel 100 is prepared (S100), and a first laser is applied to one surface of the polymer base layer 400, that is, the upper surface of the polymer base layer 400 which is in a same direction as the rear of the display panel 100 (S200). Although not shown, the second laminate 15, similarly to the first laminate 11 described above, may include a polarizing member 200, a cover window 300, a cover window protection layer 310, and an adhesive member BP disposed therebetween. However, the invention is not limited thereto.

In an embodiment, the first laser may be applied along a shape substantially a same area as the shape of the first laminate 11. In such an embodiment, the first laser may be applied in a way such that at least one linear portion and at least one curved portion are formed as in the first laminate 11 of the display device 10. A first cutting line LCL1 may be formed in the line irradiated with the first laser, and a second cutting line LCL2 may be formed in the line irradiated with the second laser. An area located outside the second cutting line LCL2 in the second laminate 15 may be a removed area RVA to be cut off by the second cutting line LCL2.

According to an embodiment, in a process of irradiating with the first laser, a hole portion HP may be formed in a part of one surface of the polymer base layer 400. In an embodiment, as shown in FIG. 16, a part of the polymer base layer 400 irradiated with the first laser may be removed to form the hole portion HP. The hole portion HP may include a sub-cut surface LCA' substantially parallel to the upper surface of the polymer base layer 400, and at least one first cutting line LCL1 perpendicular to the upper surface of the polymer base layer 400. In such an embodiment, the lower surface of the hole portion HP formed by irradiating with the first laser may be a sub-cut surface LCA', and the side surface thereof may be a first cutting line LCL1.

The height DL1 of the hole portion HP is substantially equal to the height DL1 of the first cut line LCL1 described above. However, the width WL' of the hole portion HP may be greater than the width WL (shown in FIG. 10) of the cut surface LCA of FIG. 10. The cut surface LCA of FIG. 10 may be formed by cutting a part of the sub-cut surface LCA' of the hole portion HP by irradiating with the first laser and then irradiating the hole portion HP with the second laser. In such an embodiment, the sub-cut surface LCA', which is the lower surface of the hole portion HP of FIG. 16, may have a greater width than the width of the cut surface LCA of the first laminate 11.

The structure of the hole portion HP may be formed by applying the first laser having a predetermined width PW while moving the first laser in one direction by an offset interval OSW. In such an embodiment, in the first laser irradiation process, the first laser is applied even to the area spaced by the offset interval OSW to form the hole portion HP, and the width WL' of the lower surface of the hole portion HP may be greater than the width PW of the first laser. In one embodiment, for example, the width WL' of the lower surface of the hole portion HP may be in a range of about 2 to about 2.5 times of the width PW of the first laser. In such an embodiment, the width WL' of the lower surface of the hole portion HP is formed to be larger than the width PW of the first laser, such that the formation of foreign matter by the second laser applied in the subsequent process may be minimized.

In an embodiment, the first laser may be applied in a way such that the lower surface of the hole portion HP forms a surface parallel to the upper surface of the polymer base layer 400. When the first laser is applied while moving with the offset interval OSW, the lower surface of the hole portion HP may form a flat surface by irradiating by predetermined energy for predetermined time. However, the invention is not limited thereto.

In an embodiment, the first laser may have lower energy density than the second laser, which will be described later. In an embodiment where the polymer base layer 400, as a colored polymer base layer, includes a polyimide, foreign matter may be formed on the polymer substrate layer 400 by being irradiated with the lasers or the display panel 100 may be contaminated by being irradiated with the lasers. In an embodiment, the method of manufacturing the display device 10 may include a process of applying the first laser and second laser having different energy densities from each other to effectively prevent the phenomenon described above. In one embodiment, for example, the energy density of the first laser may have a range of about 20% to about 30% of the energy density of the second laser. However, the invention is not limited thereto.

In an embodiment, as described above, the height DL2 of the second cutting line LCL2 may be smaller than the height DL1 of the first cutting line LCL1, and the second laser having a relatively large energy density may cut only a part of the polymer base layer 400. Accordingly, in such an embodiment, the area of the polymer base material layer 400 on which foreign matter is formed by the second laser may be minimized.

Figure 17:
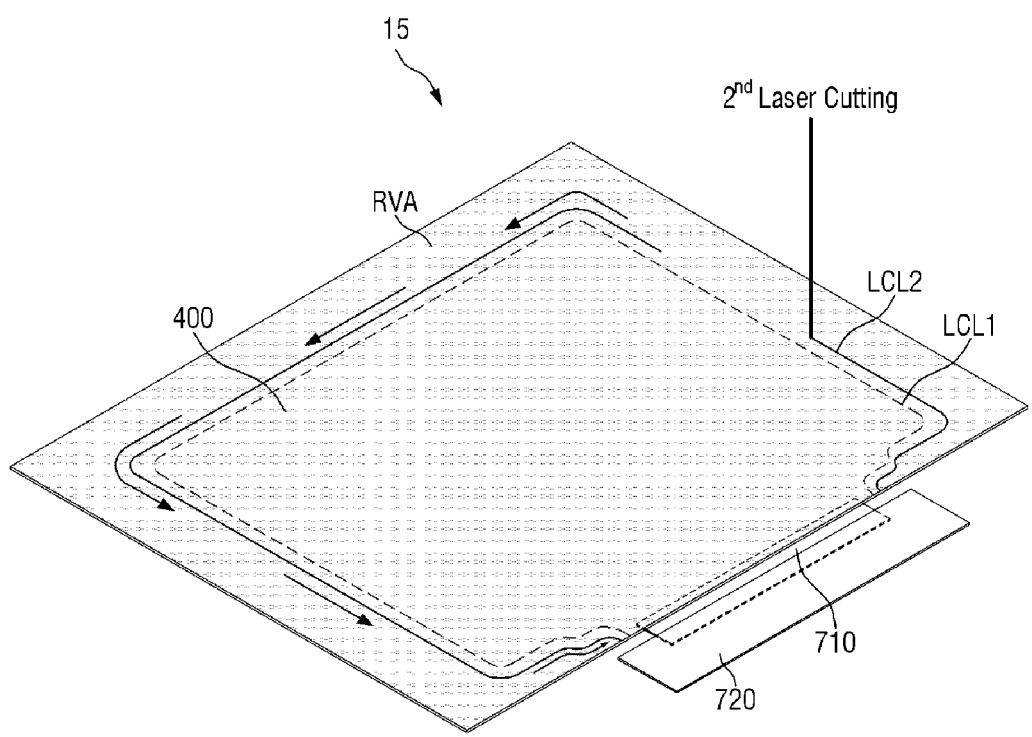
Figure 18:
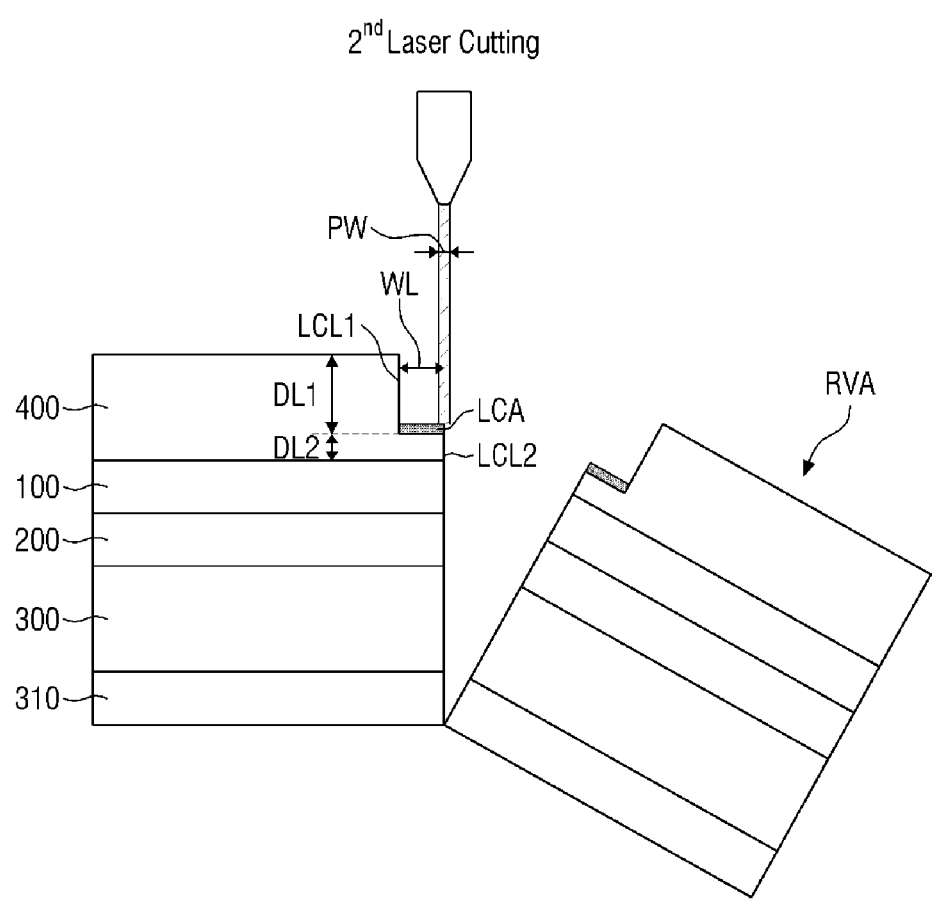

Next, referring to FIGS. 17 and 18, the second laser irradiation step (S300), in which the hole portion HP is irradiated with the second laser to form the first laminate 11 by cutting a part of the polymer base layer 400 and a part of the display panel 100, is performed.

The second laser may be applied while being spaced from the line irradiated with the first laser. The second laser may be applied to the hole portion HP to form the second cutting line LCL2 spaced apart from the first cutting line LCL1. The second laser may be applied to a part of the lower surface LCA' of the hole portion HP, and may be applied to the polarizing member 200, the cover window 300, and the cover window protection layer 310 in addition to the polymer base layer 400 and the display panel 100. As the second laser is applied, the removal area RVA of the second laminate 15 is cut and removed, and the second cutting line LCL2 may extend from the polymer base layer 400 to the cover window 300 or the cover window protection layer 310.

In an embodiment, as described above, the second laser has a larger energy density than the first laser. Since the height DL1 of the hole portion HP formed on the upper surface of the polymer base layer 400 is larger than the height DL2 of the area cut by the second laser, that is, the second cutting line LCL2, the area where foreign matter is formed by the second laser may be minimized even when the polymer base layer 400 includes colored polyimide.

In an embodiment, the second laser may have a same laser width PW as the first laser. In the first laser irradiation process (S200), as the first laser is applied with an offset interval OSW, the width WL' of the sub-cut surface LCA' of the hole portion HP is wider than the width PW of the first laser. In the second laser irradiation process S300, even when the second laser is applied to the sub-cutting surface LCA', the second laser may be applied at a point spaced apart from the first cutting line LCL1, and even when the second laser having a large energy density is applied, the contamination of the display panel 100 may be effectively prevented. When a part of the sub-cut surface LCA' is cut by the second laser, the cut surface LCA of the first laminate 11 may be formed.

The first laminate 11, in which the removal area RVA of the second laminate 15 is removed, may be formed by performing the second laser irradiation process S300. In an embodiment, as described above, the first laminate 11 may include the first cutting line LCL1, the second cutting line LCL2, and the cut surface LCA. According to an embodiment of the method of manufacturing the display device 10, a display device 10 including a first cutting line LCL1 and a second cutting line LCL2 spaced from each other on the outer side surface may be manufactured by applying a first laser and a second laser having different energy densities from each other. The display device 10 manufactured by the method described above is substantially the same as the display device described above with reference to FIGS. 1 to 13, and any repetitive detailed description thereof will be omitted.

Hereinafter, an alternative embodiment of a display device 10 will be described in detail.

Figure 19:
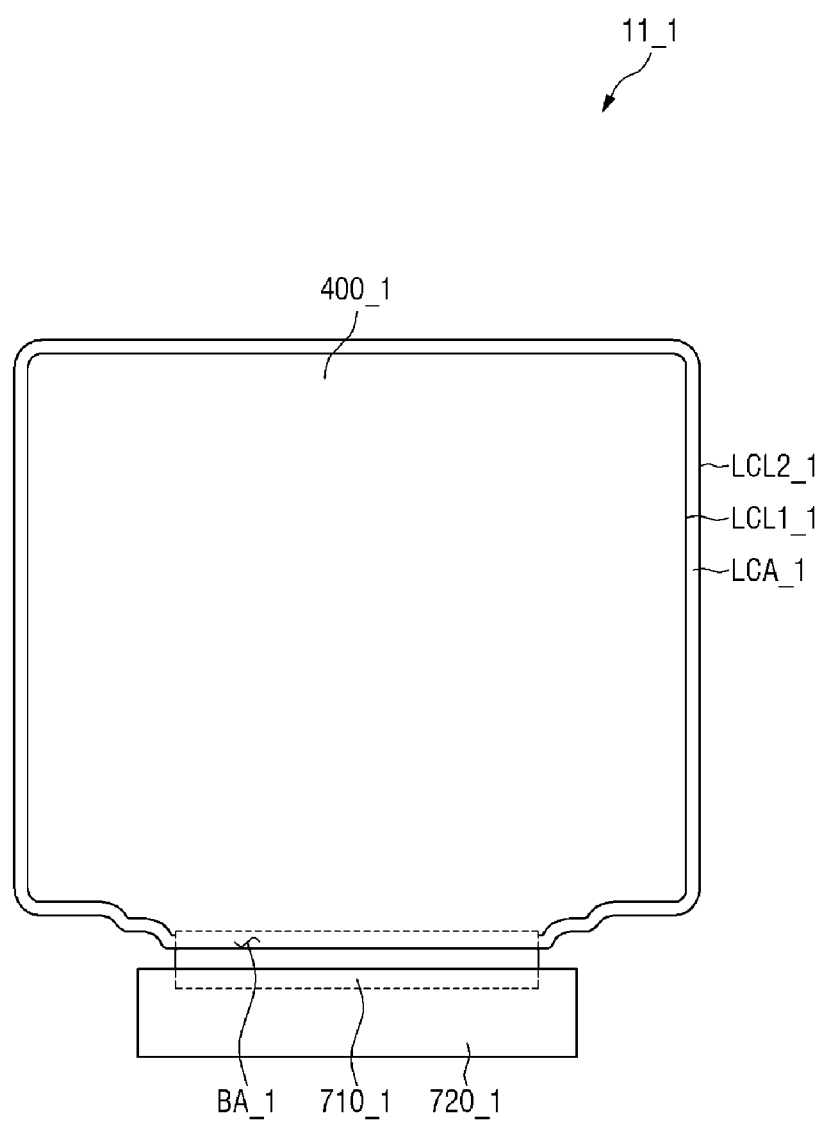
FIG. 19 is a plan view showing a first laminate of a display device according to an alternative embodiment.

FIG. 19 is a plan view showing a first laminate of a display device according to an alternative embodiment.

Referring to FIG. 19, the display device 10 may include a first laminate 11_1 including a polymer base layer 400_1 including or made of a transparent polymer material. The first laminate 11_1 of FIG. 19 is substantially the same as the first laminate 11 described above with reference to FIG. 9 except that the first laminate 11_1 includes a polymer base layer 400_1. In such an embodiment, the first laminate 11_1 may include a first circuit board 710_1 connected to the bonding area BA_1 and a second circuit board 720_1 connected to the first circuit board 710_1. Hereinafter, any repetitive detailed description of the same or like elements of the first laminate 11_1 of FIG. 19 as those of the first laminate 11 described above with reference to FIG. 9 will be omitted or simplified for convenience of description.

In an embodiment of the first laminate 11_1, as shown in FIG. 19, the polymer base layer 400_1 may include a transparent polymer material such as PET. In such an embodiment, an area where a part of the polymer base layer 400_1 is carbonized may not be formed on the cut surface LCA_1 formed in the first laser irradiation process S200 of forming the first cutting line LCL1_1. Accordingly, the first laminate 11_1 includes a first cutting line LCL1_1, a second cutting line LCL2_1, and a cut surface LCA_1 disposed therebetween, and the carbonized material, foreign matter, dirt, and the like formed on the cut surface LCA_1 may not exist.

In an embodiment, the first cutting line LCL1_1 of the first laminate 11_1 may not be formed to be perpendicular to the upper surface of the polymer base layer 400. In an embodiment, a part of the first cutting line LCL1_1 may have a curved shape or an inclined shape. Alternatively, the first cutting line LCL1 includes at least one sub-cutting line, and may further include a cut surface disposed between the sub-cutting lines.

FIGS. 20 to 23 are partial cross-sectional views showing first laminates of a display device according to other alternative embodiments.

Figure 20:
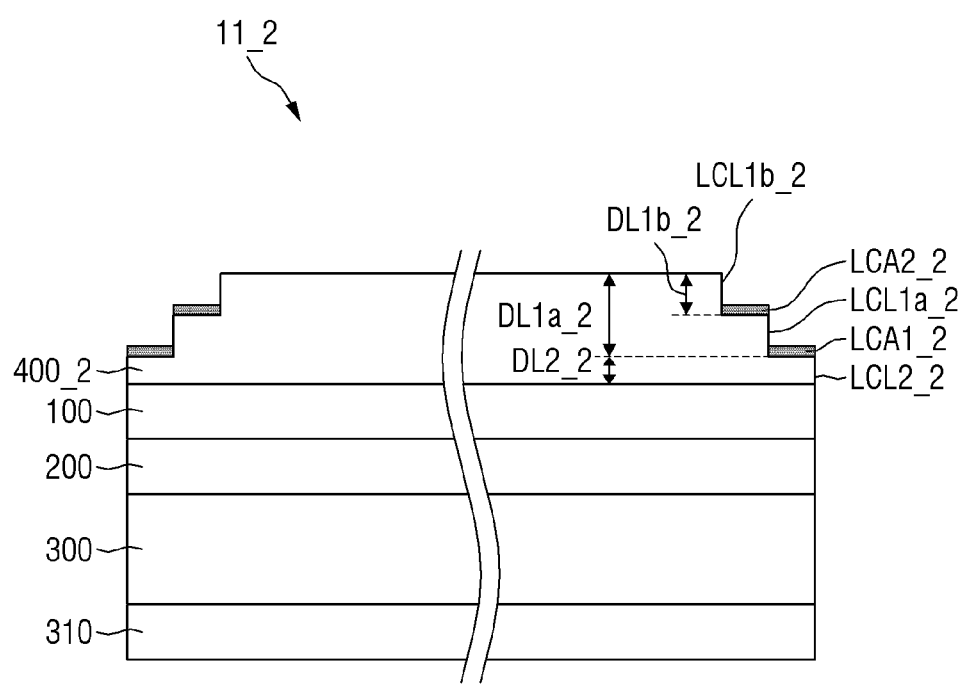
FIGS. 20 to 23 are partial cross-sectional views showing first laminates of a display device according to other alternative embodiments.

First, referring to FIG. 20, in an embodiment of a first laminate 11_2 of the display device 10, at least a part of a first cutting line LCL1_2 may be recessed inward. The first laminate 11_2 of FIG. 20 is the same as the first laminate 11 described above with reference to FIG. 10 except that the first cutting line LCL1_2 is partially recessed to form a plurality of sub-cutting lines LCL1a_2 and LCL1b_2. Hereinafter, any repetitive detailed description of the same or like elements of the first laminate 11_2 of FIG. 20 as those of the first laminate 11 described above with reference to FIG. 10 will be omitted or simplified for convenience of description.

The first cutting line LCL1_2 may include a first sub-cutting line LCL1a_2 and a second sub-cutting line LCL1b_2. A cut surface LCA_2 may include a first cut surface LCA1_2 formed between the second cutting line LCL2_2 and the first sub-cutting line LCL1a_2, and a second cut surface LCA2_2 formed between the first sub-cutting line LCL1a_2 and the second sub-cutting line LCL1b_2.

In the first laser irradiation process (S200) of forming the first cutting line LCL1_2, the upper surface of a polymer base layer 400_2 may have a hole portion HP having a width wider than the width PW of the first laser. The hole portion HP may be irradiated with the first laser with a predetermined offset interval OSW, and thus the width WL' (shown in FIG. 16) of the hole portion HP may be wider than the width PW of the first laser. Here, the first laser may be applied in a way such that the hole portion HP have different depths before and after the first laser moves by a predetermined offset interval OSW. In one embodiment, for example, the first laser may be applied by the height DL1a_2 of the first cutting line LCL1_2 during initial irradiation, and may be applied by the height DL1b_2 of the second sub-cutting line LCL1b_2 after the first laser moves by the predetermined offset interval OSW. In such an embodiment, the first laser may be applied with different time or energy when applied to an area spaced by the offset interval OSW.

Accordingly, as shown in FIG. 20, in the first laminate 11_2, a part of the first cutting line LCL1_2 is recessed inward, and the first laminate 11_2 may include a first sub-cutting line LCL1a_2 and a second sub-cutting line LCL1b_2. In such an embodiment, the height DL1a_2 of the first cutting line LCL1_2 of the polymer base layer 400 may be greater than a height DL2_2 of the second cutting line LCL2_2 of the polymer base layer 400. In an embodiment, when the first sub-cutting line LCL1a_2 and the second sub-cutting line LCL1b_2 are formed, the first laser may be applied in a way such that each of the first sub-cutting line LCL1a_2 and the second sub-cutting line LCL1b_2 has a surface parallel to the upper surface of the polymer base layer 400_2.

In an embodiment, when the first laser is applied while moving with the offset interval OSW in the first laser irradiation process (S200), the first cutting line LCL1 may not be formed perpendicular to the upper surface of the polymer base layer 400. In alternative embodiments, the first cutting line LCL1 may be formed in a way such that at least a part thereof is curved, or may have a shape inclined from the cut surface LCA.

Figure 21:
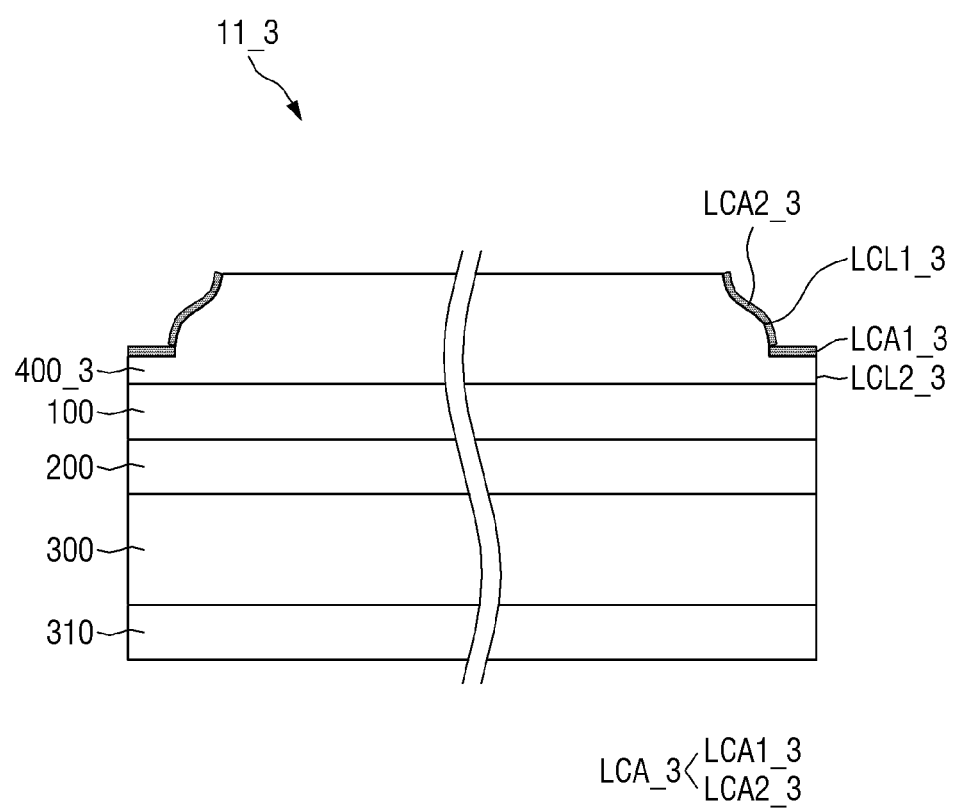

Referring to FIG. 21, in an alternative embodiment of a first laminate 11_3 of the display device 10, the first laminate 11_3 may have shape in which at least a part of a first cutting line LCL1_3 is curved, and the cut surface LCA_3 includes a first cut surface LCA1_3 disposed between the first cutting line LCL1_3 and the second cutting line LCL2_3 and a second cut surface LCA2_3 overlapping the first cutting line LCL1_3. The first laminate 11_3 of FIG. 21 is substantially the same as the first laminate 11 described above with respect to FIG. 10 except that the first cutting line LCL1_2 is partially curved, and the first laminate 11_3 further includes the second cut surface LCA2_3 overlapping the first cutting line LCL1_2. Hereinafter, any repetitive detailed description of the same or like elements of the first laminate 11_3 of FIG. 21 as those of the first laminate 11 described above with respect to FIG. 10 will be omitted or simplified for convenience of description.

In an embodiment of the first laminate 11_3, as shown in FIG. 21, the first cutting line LCL1_3 may have a curved shape. In the first laser irradiation process (S200) of forming the first cutting line LCL1_3, the first laser is vibrated and applied with an offset interval OSW. As described above with reference to FIG. 20, the first laser may be applied with different time or energy when applied with the offset interval OSW. In such an embodiment of the first laminate 11_3 of FIG. 21, the first cutting line LCL1_3 may have a curved shape as the first laser is continuously applied by the offset interval OSW.

The cut surface LCA_3 may include a first cut surface LCA1_3 and a second cut surface LCA2_3, and the second cut surface LCA2_3 may overlap the first cutting line LCL1_3. The first laser may be applied while moving by the offset interval OSW, and a second cut surface LCA2_3 in which a part of the polymer base material layer 400_3 is carbonized may also be formed on the first cutting line LCL1_3. In such an embodiment, when the second cut surface LCA2_3 is formed, the first laser may be applied while continuously moving in a way such that the second cut surface LCA2_3 is not parallel to the upper surface of the polymer base layer 400_3. However, the invention is not limited thereto.

Figure 22:
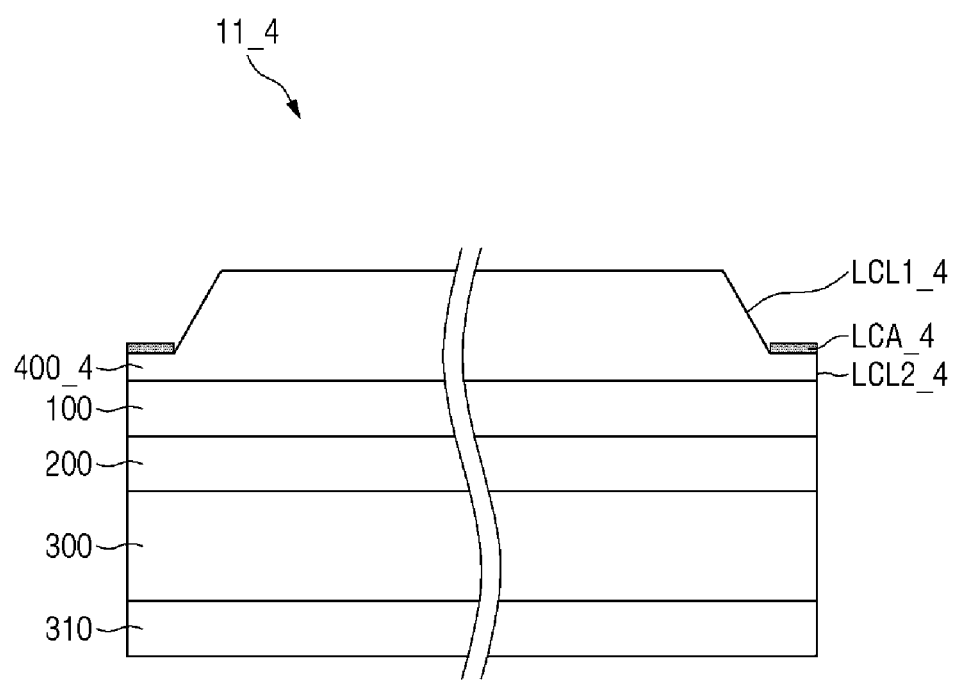

Referring to FIG. 22, in another alternative embodiment of a first laminate 11_4 of the display device 10, the first laminate 11_3 may have shape in which a first cutting line LCL1_4 is inclined toward the upper surface of a polymer base layer 400_4 on the basis of the cut surface LCA1_4 disposed between the first cutting line LCL1_4 and the second cutting line LCL2_4. The first laminate 11_4 of FIG. 22 is the same as the first laminate 11 described above with reference to FIG. 10 except that the first cutting line LCL1_4 has an inclined shape. Hereinafter, any repetitive detailed description of the same or like elements of the first laminate 11_4 of FIG. 22 as those of the first laminate 11 of FIG. 10 will be omitted or simplified for convenience of description.

In an embodiment of the first laminate 11_4, as shown in FIG. 22, when the first laser is applied while moving by the offset interval OSW, the first cutting line LCL1_4 may have an inclined shape as time or energy linearly decreases. Accordingly, the first cutting line LCL1_4 may be inclined from one end contacting the cut surface LCA_4 toward the other end contacting the upper surface of the polymer base layer 400_4.

Figure 23:
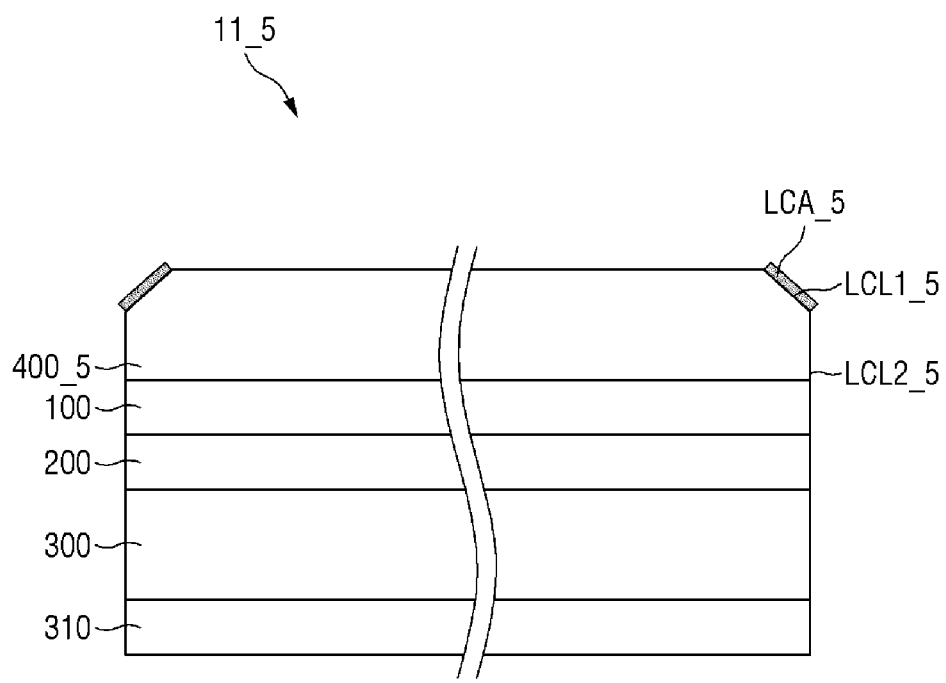

Referring to FIG. 23, in another alternative embodiment of a first laminate 11_5 of the display device 10, the first cutting line LCL1_5 may be formed such that one end thereof is in contact with one end of the second cutting line LCL2_5, and the cut surface LCA_5 may be disposed to overlap the first cutting line LCL1_5. The first laminate 11_5 of FIG. 23 is the same as the first laminate 11_4 described above with reference to FIG. 22 except that the cut surface LCA_5 may be disposed to overlap the first cutting line LCL1_5. Hereinafter, any repetitive detailed description of the same or like elements of the first laminate 11_5 of FIG. 23 as those of the first laminate 11_4 of FIG. 22 will be omitted or simplified for convenience of description.

The first laminate 11_5 of FIG. 23 may be formed in a way such that the first cutting line LCL1_5 and the second cutting line LCL2_5 are in contact with each other. The structure of the first laminate 11_5 may be formed by continuously moving without forming the cut surface LCA_5 parallel to the upper surface of the polymer base layer 400_5 when the first laser is applied with the offset interval OSW. In such an embodiment, an area where a part of the polymer base layer 400_5 is carbonized may be formed to overlap the first cutting line LCL1_5. However, the invention is not limited thereto.

In embodiments of the method of manufacturing a display device according to the invention, a predetermined area is cut by laser irradiation, e.g., first and second lasers having different energy densities from each other are applied to manufacture a display device. In such embodiments, a first cutting line is formed in an area to which the first laser is applied, a second cutting line is formed in an area to which the second laser is applied, and thus the area of a polymer base layer irradiated with the second laser having high energy density may be substantially minimized.

In embodiments of the invention, the display device includes a first cutting line or a first outer side surface, and a second cutting line or a second side surface protruding outward from the first cutting line. In such embodiments, a cut surface is disposed between the first cutting line and the second cutting line, and an area where a part of the polymer base layer is carbonized may exist in the cut surface. In the display device manufactured by such an embodiment of the manufacturing method, the carbonized area that may be formed in the polymer base layer may be minimized such that the defect rate due to foreign matter may be substantially minimized during the process of manufacturing the display device and shorten manufacturing time.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device, comprising:
 a polymer base layer including a first surface and a second surface opposite to the first surface; and
 a display panel including a third surface facing the second surface and a fourth surface opposite to the third surface,
 wherein the polymer base layer includes a first outer side surface adjacent to the first surface, a second outer side surface adjacent to the second surface and spaced outward from the first outer side surface, and a cut surface disposed between the first outer side surface and the second outer side surface.

2. The display device of claim 1, wherein
 a third outer side surface, which is an outer side surface of the display panel, is aligned with a surface extending from the second outer side surface.

3. The display device of claim 2, wherein
 a first end of the first outer surface contacting the first surface is recessed inward from a second end of the first outer surface contacting the cut surface.

4. The display device of claim 3, wherein
 the first outer side surface has a shape inclined from the second end toward the first end.

5. The display device of claim 4, wherein
 the second end of the first outer side surface is in contact with the second outer side surface, and
 a part of the cut surface overlaps the first outer side surface.

6. The display device of claim 3, wherein
 the first outer side surface includes a first sub outer side surface and a second sub outer side surface, in which a part of an area between the first end and the second end is recessed inward, and
 the cut surface includes a first cut surface between the second outer side surface and the first sub outer side surface, and a second cut surface between the first sub outer side surface and the second sub outer side surface.

7. The display device of claim 2, wherein
 a height of the second outer side surface is in a range of about 20% to about 40% of a thickness of the polymer base layer, and
 a width of the cut surface is a range of about 40% to about 75% of a height of the second outer side surface.

8. The display device of claim 7, wherein
 the height of the second outer side surface is in a range of about 40 μm to about 50 μm, and
 the width of the cut surface is in a range of about 20 μm to about 30 μm.

9. The display device of claim 1, wherein
 the polymer base layer includes polyimide.

10. The display device of claim 9, further comprising:
 a polarizing member disposed on the fourth surface of the display panel;
 a cover window disposed on the polarizing member; and
 a heat radiation member disposed on the first surface of the polymer base layer.

11. The display device of claim 10, wherein
 the display device includes linear portions and curved portions, and
 at least one of the linear portions includes a first sub-linear portion, a second sub-linear portion spaced apart from the first sub-linear portion in one direction, and a sub-curved portion connecting the first sub-linear portion and the second sub-linear portion.

12. A display device, which is an in-foldable display wherein a display surface thereof is folded to face inward, the display device comprising:
 a display panel including a front surface and a rear surface opposite to the front surface, where the display panel displays an image on the front surface thereof;

a polarizing member disposed on the front surface of the display panel;

a cover window disposed on the polarizing member;

a polymer base layer including a first surface and a second surface opposite to facing the first surface, and disposed on the rear surface of the display panel; and a heat radiation member disposed under the polymer base layer, wherein the polymer base layer includes a first outer side surface adjacent to the first surface, a second outer side surface adjacent to the second surface and spaced outward from the first outer side surface, and a cut surface disposed between the first outer side surface and the second outer side surface, and a third outer side surface, which is an outer side surface of the display panel, is aligned with a surface extending from the second outer side surface.

13. The display device of claim 12, wherein a height of the second outer side surface is a range of about 20% to about 40% of a thickness of the polymer base layer, and a width of the cut surface is a range of about 40% to about 75% of a height of the second outer side surface.

14. The display device of claim 13, wherein the display device includes linear portions and curved portions, and at least one of the linear portions includes a first sub-linear portion, a second sub-linear portion spaced apart from the first sub-linear portion in one direction, and a sub-curved portion connecting the first sub-linear portion and the second sub-linear portion.

15. A method of manufacturing a display device, the method comprising:

preparing a first laminate including a display panel and a polymer base layer disposed on the display panel;

irradiating one surface of the polymer base layer with a first laser to form a hole portion in which a part of the one surface is recessed; and irradiating the hole portion with a second laser different from the first laser to form a second laminate by cutting a part of the polymer base layer and a part of the display panel.

16. The method of claim 15, wherein the hole portion includes a first cutting line perpendicular to the one surface of the polymer base layer and a first cut surface horizontal to the one surface thereof, and the second laser is applied to the first cut surface.

17. The method of claim 16, wherein when the second laser is applied to the hole portion, the part of the display panel and the part of the polymer base layer are cut, and the polymer base layer of the second laminate includes the first cutting line, a second cutting line protruding outward from the first cutting line, and a second cut surface between the first cutting line and the second cutting line.

18. The method of claim 17, wherein an energy density of the first laser is a range of about 20% to about 30% of an energy density of the second laser.

19. The method of claim 18, wherein a width of the first cut surface is a range of about 2 times to about 2.5 times of a width of the first laser.

20. The method of claim 17, wherein the display panel is disposed on another surface of the polymer base layer opposite to the one surface of the polymer base layer, and an outer side surface of the display panel is aligned with a surface extending from the second outer side surface.

* * * * *